United States Patent
Ozbek et al.

(10) Patent No.: US 12,106,028 B2
(45) Date of Patent: Oct. 1, 2024

(54) OPTIMIZATION BASED ON PREDICTED TOOL PERFORMANCE

(71) Applicant: Schlumberger Technology Corporation, Sugar Land, TX (US)

(72) Inventors: Ali Ozbek, Cambridge (GB); Riadh Boualleg, Stonehouse (GB); Ling Li, Stonehouse (GB)

(73) Assignee: Schlumberger Technology Corporation, Sugar Land, TX (US)

(*) Notice: Subject to any disclaimer, the term of this patent is extended or adjusted under 35 U.S.C. 154(b) by 0 days.

(21) Appl. No.: 18/060,977

(22) Filed: Dec. 2, 2022

(65) Prior Publication Data

US 2023/0186000 A1 Jun. 15, 2023

Related U.S. Application Data

(63) Continuation of application No. 17/999,291, filed as application No. PCT/US2021/033316 on May 20, 2021.

(Continued)

(51) Int. Cl.
*E21B 7/04* (2006.01)
*E21B 41/00* (2006.01)
(Continued)

(52) U.S. Cl.
CPC .............. *G06F 30/27* (2020.01); *E21B 7/04* (2013.01); *E21B 41/00* (2013.01); *E21B 44/00* (2013.01);
(Continued)

(58) Field of Classification Search
CPC ........ E21B 7/04; E21B 44/00; E21B 2200/20; E21B 2200/22
(Continued)

(56) References Cited

U.S. PATENT DOCUMENTS 6,424,919 B1  7/2002  Moran et al.
6,549,879 B1  4/2003  Cullick et al.
(Continued)

OTHER PUBLICATIONS

Search Report and Written Opinion of International Patent Application No. PCT/US2021/033316 dated Sep. 2, 2021, 13 pages.
(Continued)

*Primary Examiner* — Kenneth L Thompson
(74) *Attorney, Agent, or Firm* — Jeffrey D. Frantz

(57) ABSTRACT

A method to design well trajectories includes determining dogleg severity as a function of inclination, and a corresponding rate of penetration performance of the tool by a hybrid model including physical modelling and machine learning correction. The method includes solving for optimal steering parameters to predict a dogleg severity as close as possible to a desired dogleg severity at a given inclination of the trajectory, which is repeated for dogleg severity and inclination combinations of interest. The rate of penetration for feasible points is also determined and a rate of penetration (or time-to-target) map can be produced. Potential trajectories are then evaluated relative to the map to estimate drilling time-to-target, and an optimal trajectory can be selected that has a lowest time-to-target while also being feasible for the tool and optionally avoiding risks or downhole obstacles.

15 Claims, 25 Drawing Sheets

Related U.S. Application Data

(60) Provisional application No. 63/043,970, filed on Jun. 25, 2020, provisional application No. 63/027,464, filed on May 20, 2020.

(51) Int. Cl.
    *E21B 44/00*     (2006.01)
    *E21B 49/00*     (2006.01)
    *G06F 30/13*     (2020.01)
    *G06F 30/27*     (2020.01)

(52) U.S. Cl.
    CPC .............. *E21B 49/00* (2013.01); *G06F 30/13* (2020.01); *E21B 2200/20* (2020.05); *E21B 2200/22* (2020.05)

(58) Field of Classification Search
    USPC ........................................................ 175/61
    See application file for complete search history.

(56) References Cited

U.S. PATENT DOCUMENTS

| | | | |
|---|---|---|---|
| 7,460,957 B2 | 12/2008 | Prange et al. | |
| 8,401,795 B2 | 3/2013 | Kaageson-Loe | |
| 8,527,248 B2 | 9/2013 | Thambynayagam et al. | |
| 8,596,385 B2 * | 12/2013 | Benson | E21B 7/06 175/45 |
| 8,672,055 B2 * | 3/2014 | Boone | E21B 7/04 175/45 |
| 8,751,208 B2 | 6/2014 | Brouwer et al. | |
| 8,838,426 B2 * | 9/2014 | Aldred | E21B 7/04 703/10 |
| 9,286,437 B2 | 3/2016 | Colvin et al. | |
| 9,297,205 B2 * | 3/2016 | Benson | E21B 47/022 |
| 9,720,555 B2 * | 8/2017 | Sorden | G06T 11/60 |
| 9,810,052 B2 | 11/2017 | AlQahtani et al. | |
| 9,938,815 B2 * | 4/2018 | Samuel | E21B 47/022 |
| 10,302,785 B2 | 5/2019 | Dirksen et al. | |
| 10,830,033 B2 * | 11/2020 | Weideman | E21B 7/061 |
| 11,174,718 B2 * | 11/2021 | Gillan | E21B 7/067 |
| 11,346,215 B2 * | 5/2022 | Vempati | G01V 11/002 |
| 11,408,228 B2 * | 8/2022 | Groover | E21B 47/013 |
| 11,466,555 B2 * | 10/2022 | Samuel | E21B 41/00 |
| 11,675,938 B2 * | 6/2023 | Marchidan | G06N 20/00 703/10 |
| 11,795,814 B2 | 10/2023 | Verma | |
| 2002/0103630 A1 | 8/2002 | Aldred et al. | |
| 2013/0341093 A1 | 12/2013 | Jardine et al. | |
| 2014/0379133 A1 | 12/2014 | Toma | |
| 2016/0160625 A1 | 6/2016 | Maloney | |
| 2017/0248006 A1 | 8/2017 | Hess et al. | |
| 2018/0003026 A1 * | 1/2018 | Boone | E21B 7/04 |
| 2019/0284921 A1 | 9/2019 | Xue et al. | |
| 2020/0072034 A1 | 3/2020 | Zalluhoglu et al. | |
| 2020/0242286 A1 | 7/2020 | Marchidan et al. | |
| 2023/0186000 A1 | 6/2023 | Ozbek et al. | |

OTHER PUBLICATIONS

Office Action issued in U.S. Appl. No. 17/999,291 dated Dec. 14, 2023, 8 pages.

Notice of Allowance issued in U.S. Appl. No. 17/999,291 dated May 8, 2024, 15 pages.

2nd Examination Report in Saudi Arabian Application SA-PCT 522441370 dated Jun. 3, 2024, 10 pages.

\* cited by examiner

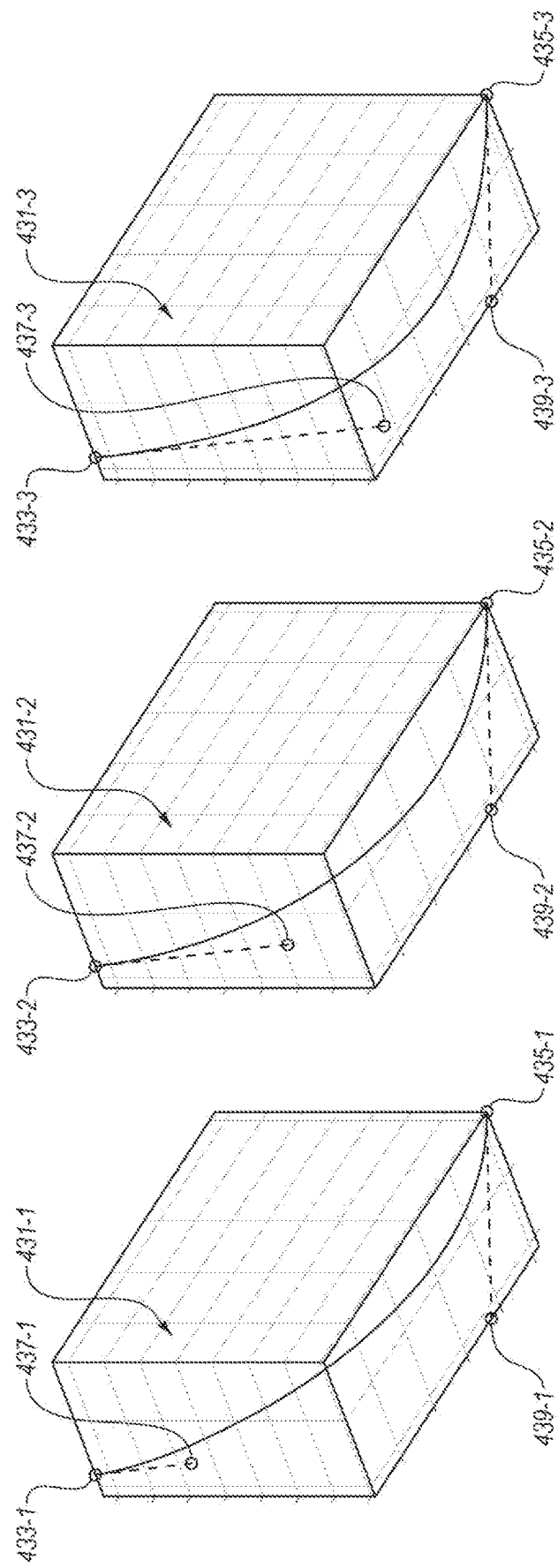

OPTIMIZATION BASED ON PREDICTED TOOL PERFORMANCE

CROSS-REFERENCE TO RELATED APPLICATIONS

This application is a continuation of U.S. patent application Ser. No. 17/999,291, filed Nov. 18, 2022, which is a national stage entry under 35 U.S.C. 371 of International Application No. PCT/US2021/033316, filed May 20, 2021, and which claims the benefit of, and priority to, U.S. Patent Application No. 63/027,464, filed May 20, 2020 and U.S. Patent Application No. 63/043,970, filed Jun. 25, 2020, and is related to U.S. Patent Application No. 62/950,934, filed Dec. 20, 2019. Each of the foregoing is incorporated herein by this reference in its entirety.

BACKGROUND

Traditional wellbore drilling practices attempted to drill wells as near to the vertical as possible; however, it is now common to drill directional or deviated wells by directing a drill bit along a defined trajectory to a predetermined target. With increased directional drilling capabilities, there has been an increased desire for directional drilling, and directional drilling is being applied in myriad applications and formations, causing wellbore trajectories to become increasingly more complex.

Wellbore trajectory planning can be accomplished by, for instance, plotting together a series of curve and hold sections, and then reviewing and repeating this for the sections until well planners obtain a satisfactory trajectory. During this process, trajectories may be evaluated based on formation, drilling, or trajectory parameters such as formation type and properties, dog-leg severity, torque, drag, and drilling rig requirements or limitations.

After drilling commences, it may be realized that the tools may have deviated from the plan or that the pre-planned trajectory may not arrive at the desired target, and that a trajectory correction should be applied. Alternatively, it may be determined that the desired target has changed, and that the trajectory should change to reach the new target. Trajectory planning may therefore occur offline before drilling starts, but also in near real-time to control or re-plan the trajectory.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. While some of the drawings may be schematic or exaggerated representations of concepts, at least some of the drawings may be drawn to scale, but represent concepts that may have other dimensions or scale in other applications or conditions. Understanding that the drawings depict some example embodiments, the embodiments will be described and explained with additional specificity and detail through the use of the accompanying drawings in which:

FIGS. 4-1 to 4-3 are three-dimensional graphs of the shape of a Bézier curve that can be changed by adjusting the position of one of the control points along a starting tangent, according to embodiments of the present disclosure;

FIG. 5-1 is a comparison of the optimal trajectory of FIG. 3 with a trajectory designed based on the minimum curvature principle, along with corresponding drilling time-to-target values estimated using a predicted rate of penetration model, according to some embodiments of the present disclosure;

FIGS. 5-2 to 5-5 are comparisons of dogleg severity, rate of penetration, drilling time, and inclination attributes of the two trajectories shown in FIG. 5-1, according to some embodiments of the present disclosure;

FIG. 18-1 is a weight-on-bit profile of the optimal trajectory of FIG. 3, according to some embodiments of the present disclosure;

FIG. 18-2 is a flow rate profile of the optimal trajectory of FIG. 3, according to some embodiments of the present disclosure;

FIG. 18-3 is a surface rotational speed profile of the optimal trajectory of FIG. 3, according to some embodiments of the present disclosure;

FIG. 18-4 is a steering ratio profile of the optimal trajectory of FIG. 3, according to some embodiments of the present disclosure;

FIG. 19-1 is a chart showing an extended rate of penetration model created to improve convergence for an optimization procedure for trajectory parameters by using pseudo rate of penetration values in an infeasible zone, according to some embodiments of the present disclosure;

FIG. 19-2 is a chart showing an extended rate of penetration model similar to that of FIG. 19-1, where the infeasible zone includes small rate of penetration values that rapidly decline with dogleg severity, according to some embodiments of the present disclosure;

FIG. 20-1 is a time to target map for feasible target positions that can be reached with a 90-degree build trajectory, using a generalized superellipse template and optimization based on an originally predicted rate of penetration model, according to some embodiments of the present disclosure;

FIG. 20-2 is a time to target map similar to that of FIG. 20-1, but using an extended rate of penetration model, according to some embodiments of the present disclosure;

FIG. 21-1 is a map of time-to-target values for a trajectory section between an origin and a kickoff point, along with three example trajectories within the map, according to an embodiment of the present disclosure;

FIG. 21-2 is a map of time-to-target values for a trajectory section between a kickoff point and a final target, along with three example trajectories within the map, according to an embodiment of the present disclosure;

FIG. 21-3 is a map of total time-to-target values for a drilling trajectory composed of two sections, and includes three example trajectories within the map, according to an embodiment of the present disclosure;

DETAILED DESCRIPTION

Embodiments of the present disclosure relate to devices, systems, and methods for optimizing a wellbore trajectory, a steering design, or both, based on predicted tool performance. For instance, in some embodiments, a rate of penetration model may be used to determine total drilling time to target. The rate of penetration model may be based on use of physics-based model and machine learning corrections to determine steering parameters that provide desired dogleg severity or other tool performance capabilities.

Figure 1:
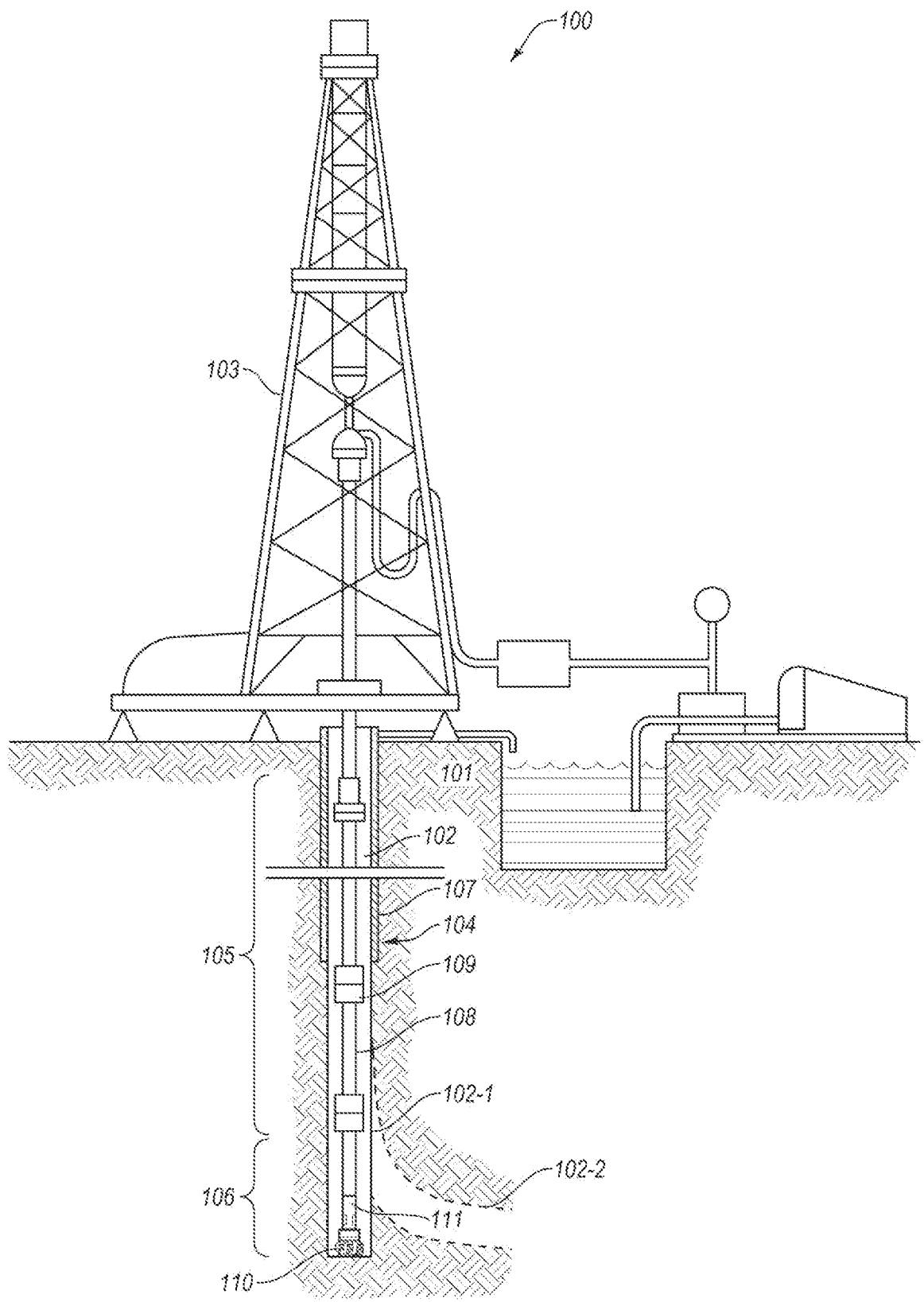
FIG. 1 is a schematic illustration of a wellbore drilling system, including surface systems and downhole tools used for drilling a wellbore, according to some embodiments of the present disclosure.

By way of background, FIG. 1 shows one example of a drilling system 100 for drilling an earth formation 101 to form a wellbore 102. The drilling system 100 includes a drill rig 103 used to turn a drilling tool assembly 104 which extends downward into the wellbore 102. The drilling tool assembly 104 may include a drill string 105, a bottomhole assembly (BHA) 106, and a bit 110, attached to the downhole end of drill string 105.

The drill string 105 may include several joints of drill pipe 108 connected end-to-end through tool joints 109. The drill string 105 transmits drilling fluid through a central bore and transmits rotational power from the drill rig 103 to the BHA 106. In some embodiments, the drill string 105 may further include additional components such as subs, pup joints, etc. The drill pipe 108 provides a hydraulic passage through which drilling fluid is pumped from the surface. The drilling fluid discharges through nozzles, jets, or other orifices in the bit 110 for the purposes of cooling the bit 110 and cutting structures thereon, for lifting cuttings out of the wellbore 102 as it is being drilled, for controlling influx of fluids in the well, for maintaining the wellbore integrity, and for other purposes.

The BHA 106 may include the bit 110 or other components. An example BHA 106 may include additional or other components (e.g., coupled between to the drill string 105 and the bit 110). Examples of additional BHA components include drill collars, stabilizers, measurement-while-drilling (MWD) tools, logging-while-drilling (LWD) tools, downhole motors, underreamers, section mills, hydraulic disconnects, jars, vibration or damping tools, other components, or combinations of the foregoing. The BHA 106 may further include a directional tool 111 such as a bent housing motor or a rotary steerable system (RSS). The directional tool 111 may include directional drilling tools that change a direction of the bit 110, and thereby the trajectory of the wellbore. In some cases, at least a portion of the directional tool 111 may maintain a geostationary position relative to an absolute reference frame, such as gravity, magnetic north, or true north. Using measurements obtained with the geostationary position, the directional tool 111 may locate the bit 110, change the course of the bit 110, and direct the directional drilling tool 111 on a projected trajectory. For instance, although the BHA 106 is shown as drilling a vertical portion 102-1 of the wellbore, the BHA 106 (including the directional tool 111) may instead drill directional or deviated well portions, such as directional portion 102-2.

In general, the drilling system 100 may include additional or other drilling components and accessories, such as special valves (e.g., kelly cocks, blowout preventers, and safety valves). Additional components included in the drilling system 100 may be considered a part of the drilling tool assembly 104, the drill string 105, or a part of the BHA 106 depending on their locations in the drilling system 100.

In some embodiments, the BHA 106 may include a downhole motor to power for downhole systems and/or provide rotational energy for downhole components (e.g., rotate the bit 110, drive the directional tool 111, etc.). The downhole motor may be any type of downhole motor, including a positive displacement pump (such as a progressive cavity motor) or a turbine. In some embodiments, a downhole motor may be powered by the drilling fluid flowing through the drill pipe 108. In other words, the drilling fluid pumped downhole from the surface may provide the energy to rotate a rotor in the downhole motor. The downhole motor may operate with an optimal pressure differential or pressure differential range. The optimal pressure differential may be the pressure differential at which the downhole motor may not stall, burn out, overspin, or otherwise be damaged. In some cases, the downhole motor may rotate the bit 110 such that the drill string 105 may not be rotated at the surface, or may rotate at a different rate (e.g., slower) than the rotation of the bit 110.

The bit 110 in the BHA 106 may be any type of bit suitable for degrading downhole materials such as earth formation 101. Example types of drill bits used for drilling earth formations are fixed-cutter or drag bits, roller cone bits, and combinations thereof. In other embodiments, the bit 110 may be a mill used for removing metal, composite, elastomer, other downhole materials, or combinations thereof. For instance, the bit 110 may be used with a whipstock to mill into casing 107 lining the wellbore 102. The bit 110 may also be a junk mill used to mill away tools, plugs, cement, other materials within the wellbore 102, or combinations thereof. Swarf or other cuttings formed by use of a mill may be lifted to surface or may be allowed to fall downhole. In still other embodiments, the bit 110 may include a reamer. For instance, an underreamer may be used in connection with a drill bit and the drill bit may bore into the formation while the underreamer enlarges the size of the bore.

During the process of constructing the wellbore 102, choosing the right tool for a particular job can be challenging. For example, in directional wells, a well plan may call for a particular trajectory. Knowing in advance whether a particular tool or BHA can achieve that trajectory can be difficult, particularly when tools are being operated at or near their limits. Service providers and operators want to increase the ability of the tools to follow trajectory events.

Embodiments disclosed herein relate to improving trajectory optimizations based on tool performance. In one embodiment, a method to design well trajectories is based on the determination of the dogleg severity (DLS) and rate of penetration (ROP) performance of the tool by physical modelling (e.g., using a physics-based modeling/simulation (PBM) tool such as IDEAS® modeling software of Schlumberger Limited), followed by machine learning (ML) model correction. The inventors have noted that some drilling tools have shown that physical modelling using PBM can overestimate the DLS capability of the tool, leading to significant divergence with the planned trajectory during drilling. As described herein, this can be mitigated by using acquired data and machine learning (e.g., Gaussian process regression) to predict a correction term to what was suggested by PBM. Thus, this approach can be applied to designing new trajectories, rather than as an evaluation mechanism for existing trajectory designs.

Previous data analysis has shown that the ROP for some drilling tools at a given segment of the trajectory depends on both the DLS and the inclination (INC) of that segment. With an objective to minimize the drilling time-to-target, finding the globally optimum strategy becomes a computationally challenging problem, as the path and velocity are coupled. Computational speed is important, particularly for a real-time application since the design method would not only execute while offline before drilling starts, but for real-time trajectory control and re-planning as well.

According to some embodiments, in order to speed up the solution to the optimization problem, the DLS capability of the tool is characterized offline, using a PBM+ML methodology as noted above. This capability is achieved by solving for optimal steering (drilling) parameters. Examples of such parameters can include, but are not limited to combinations of, weight-on-bit (WOB), surface flow rate, surface rotational speed, steering ratio, toolface (TF) angle, etc., so that the predicted DLS is as close as possible to the desired DLS value, at a given inclination of the trajectory. This process can be repeated for many combinations of DLS+INC of interest, and potentially all combinations of interest. Through this set of computations, the predicted ROP is obtained for various (and potentially all) feasible points in a DLS/INC plane. The maximum achievable DLS for the various inclinations can also be output. In some embodiments, it was observed that the upper DLS bound increases as a function of inclination. One of the by-products of the PBM+ML approach can also be an uncertainty estimate of the predicted DLS.

According to certain embodiments, using an ROP map as a function of DLS and INC, any potential trajectory can be evaluated to determine if the trajectory is feasible for the evaluated tool, and to also estimate the drilling time-to-target (T2T). The candidate trajectories could be given by a well planner (including a well operator, service company, etc.), produced according to an industry standard such as the minimum curvature principle), using trajectories of offset wells, or using other geometrical templates. In some particular embodiments, two types of templates have been used, including generalized superellipses for 2D designs, and Bézier curves for both 2D and 3D designs. Each curve can be characterized with a number of parameters, although it has been found that a search with a limited number of parameters (e.g., two, three, etc.) can result in a very fast computation of the optimal trajectory.

Using this approach, an optimal trajectory design can be found for each of various potential kickoff point (KOP)-target pairs, including complete prediction of potentially each steering parameter and the ROP along the trajectory, as well as the minimum time to target (T2T) or minimum T2T. We can therefore plot a map of T2 Ts for all potential KOPs for a given target location, which can be used for well placement and KOP design.

Providing New Wellbore Trajectories

Figure 2:
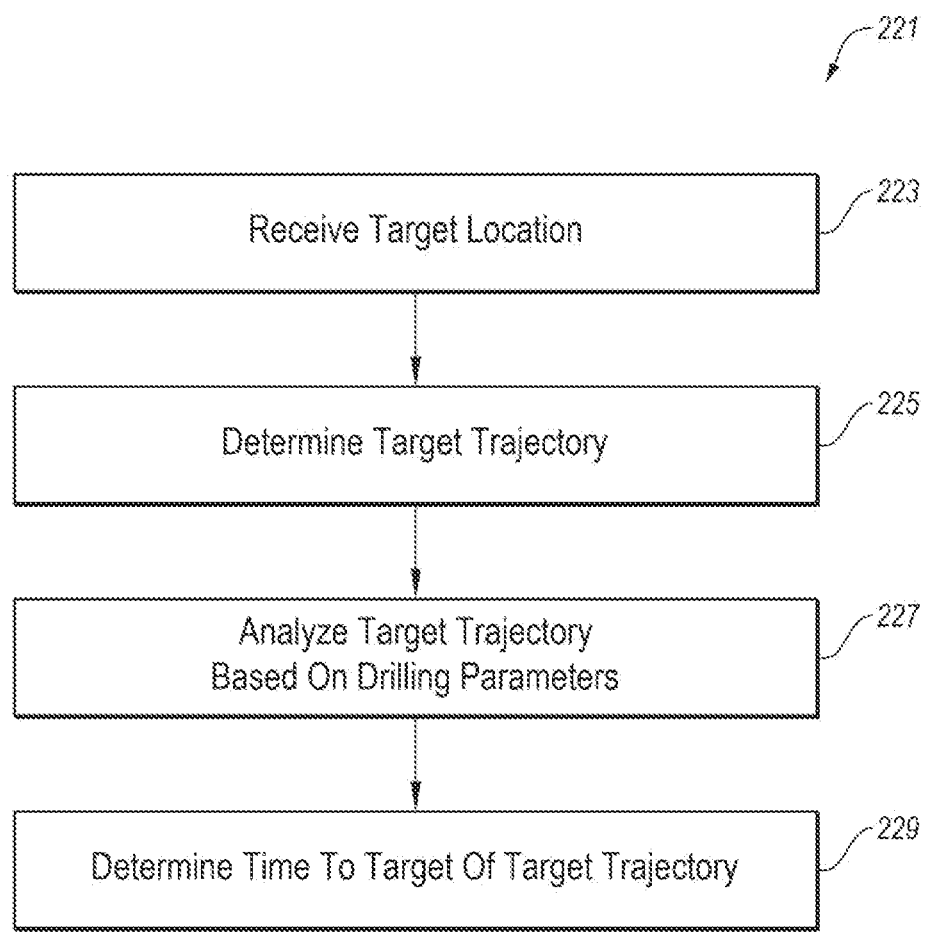
FIG. 2 is a flow chart of a method for designing a wellbore, according to some embodiments of the present disclosure

FIG. 2 is a representation of a method 221 for designing a wellbore, according to at least one embodiment of the present disclosure. The method 221 may include receiving a target location for a wellbore at 223. The target location may be a location downhole, such as a reservoir. The target location has a vertical offset (e.g., a depth) which may be the depth of the target location. In some embodiments, the target location may have a horizontal offset, which may be a distance from the surface location of the wellbore.

In some embodiments, the method 221 may include predicting one or more capabilities of a downhole drilling tool. The capabilities may be predicted based on a downhole tool model, which may be formed from one or more downhole tool parameters. The capabilities of the downhole drilling tool may include an achievable DLS for a given INC, a ROP for the combination of DLS and INC, and downhole drilling parameters to achieve the calculated ROP, such as WOB, flow rate, RPM, steering ratio, any other downhole drilling parameter, and combinations thereof.

When planning a wellbore, a target trajectory may be determined at 225. As discussed in further detail herein, determining the target trajectory may include determining a vertical trajectory, determining a dogleg trajectory, determining a kickoff point (KOP) where the vertical trajectory changes to the dogleg trajectory, and so forth. In some embodiments, determining the target trajectory may take into account drilling system parameters, such as bit type, bit diameter, BHA tools, surface drilling parameters, and so forth. The target trajectory may be planned using a known DLS capability of the particular BHA.

In some embodiments, the drilling parameters, including one or more calculated drilling parameters, for the target trajectory may be analyzed at 227. For example, the target trajectory may be analyzed for ROP, WOB, flow rate, RPM, steering rate, any other drilling parameter, and combinations thereof. In some embodiments, the target trajectory may be analyzed to determine viability of the target trajectory. For example, one or more combinations of INC and DLS may not be possible to perform based on the modeled BHA setup. If the target trajectory is determined to not be viable, then the target trajectory may be discarded.

In some embodiments, the method 221 may include determining a time to the target (T2T) for the target trajectory at 229. The T2T may include an analysis of the ROP for the BHA given the particular BHA setup and drilling parameters. In some embodiments, the T2T may be used to determine whether or not the target trajectory is selected. In some embodiments, if the target trajectory is determined to not be viable, then a T2T may be raised to a maximum value. This may help to prevent returning an error or including blank spaces in a visual analysis of the T2T.

Conventional drilling trajectories may be determined using a combination of one or more straight lines and one or more circular arcs (e.g., the minimum curvature method). In some embodiments, a parametric template, such as a generalized superellipse and/or a Bézier curve.

Generalized Superellipse

The general equation for a superellipse is given by Equation 4

$$\left|\frac{x}{a}\right|^m + \left|\frac{z}{b}\right|^n = 1,$$ EQ. 4 where m and n are parameters to be determined, and control the shape of the trajectory. This type of template may be particularly useful to generate 90° continuous build trajectories, which are one of the more common trajectory sections. A 90° continuous build trajectory may include a vertically drilled well that transitions to a laterally drilled well. In a 90° continuous build, the drilling speed (ROP) may be relatively low due to the high curvature (high DLS). In the case of a 90° continuous build section, a and b would be the coordinates of the target with respect to the starting point, which is also referred to as the kickoff point (KOP). In general, for m≠n, the curve is a generalized superellipse;
for m=n, the curve is a superellipse;
for m=n=2, the curve is an ellipse; and
for m=n=2, and a=b, the curve is a circle.

To optimize the superellipse, a cost function may be applied to determine the optimal design parameter values for m and n. In some embodiments, the cost may include any number of factors, such as the estimated T2T (e.g., integrated ROP). The T2T could include, for instance, the estimated drilling time to the target, i.e., integrated ROP.

Figure 3:
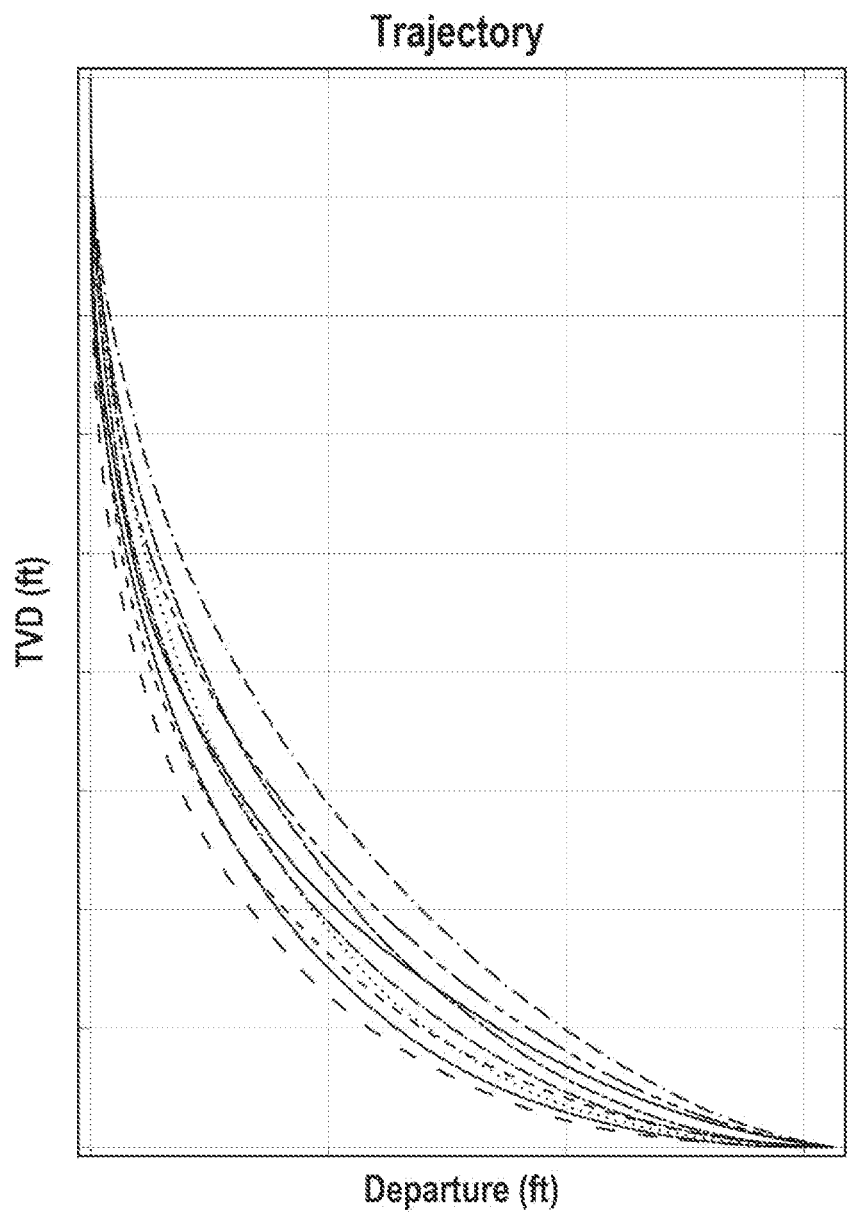
FIG. 3 is a chart illustrating a family of 90-degree continuous build trajectories created using a generalized superellipse template, including an optimal trajectory (green) and eight other trajectories with m and n values within ±0.5 of the optimal value, according to some embodiments of the present disclosure.

FIG. 3 is a representation of several 90° continuous build trajectories designed using a generalized superellipse template. For these sample calculations, consider a target having a horizontal offset (departure) of 625 ft. (191 m) and a vertical offset or true vertical depth (TVD) of 900 ft. (274 m) with respect to the starting point of the section. In some embodiments, the starting point may be the KOP for the 90° continuous build, or the inflection point or location in the drilling trajectory where the trajectory changes between vertical and the 90° continuous build section.

As may be seen in FIG. 3, the different trajectories may have different INC and DLS at any given location along the curve. Using the combination of INC and DLS, several drilling parameters may be computed. For example, the combination of INC and DLS may be used to determine ROP, WOB, drilling fluid flow rate, RPM, steering ratio, any other downhole parameter, and combinations thereof. These drilling parameters may then be inserted into the cost function to rate or score the trajectory. For example, the drilling parameters may be used to determine the ROP, and a total T2T may be calculated In some examples, a BHA may experience wear and tear at particular drilling parameters, such as high WOB or fluid flow, and the cost function may assign a wear and tear score to the target trajectory (such as a maintenance cost score).

In accordance with embodiments of the present disclosure, the optimal trajectory may be the trajectory that has the lowest cost. For example, the optimal trajectory may have a minimized predicted drilling time (integral of ROP across the trajectory). To determine the optimal trajectory, the method 221 of FIG. 2 may be repeated multiple times and the calculated costs compared to determine which trajectory has the lowest cost. In the embodiment shown in FIG. 12, the optimized values of the template parameters may be m=1.9798 and n=2.6486.

As will be appreciated by one skilled in the art, the trajectories shown in FIG. 3 are for illustration purposes only, and the optimization procedures described herein can potentially consider all possible trajectories according to the template and processes described herein.

Bézier Curves

Figures 1, 5:
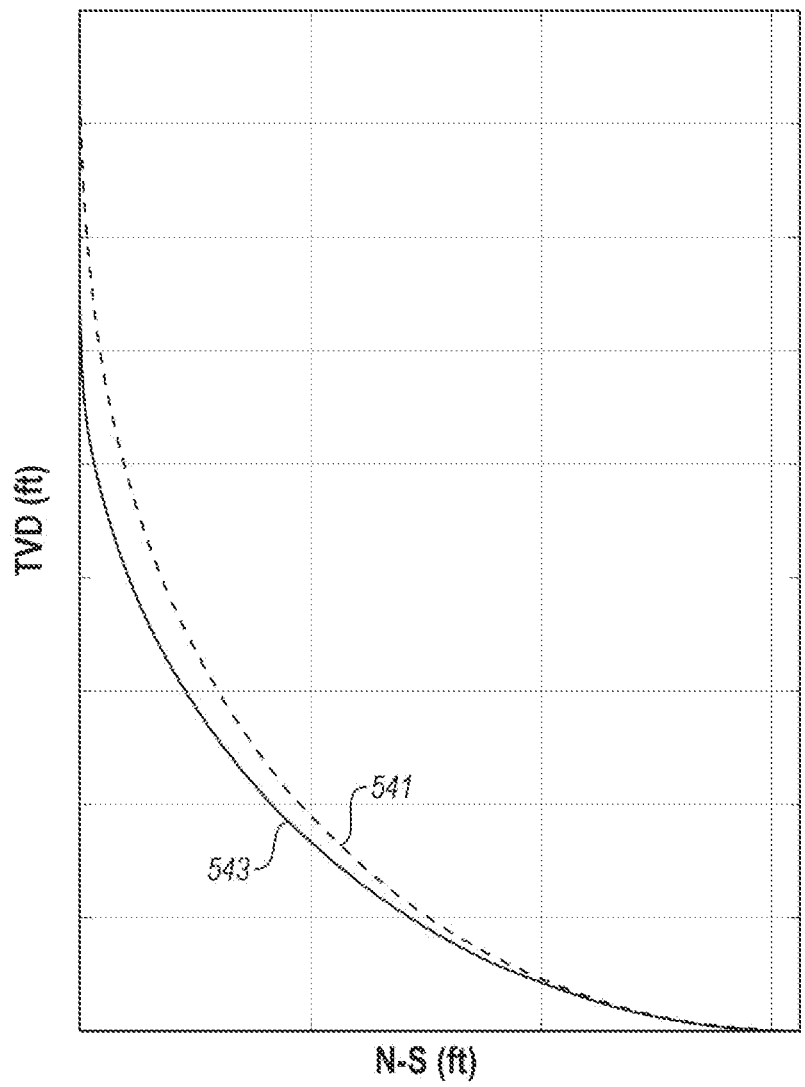
Figure 5:
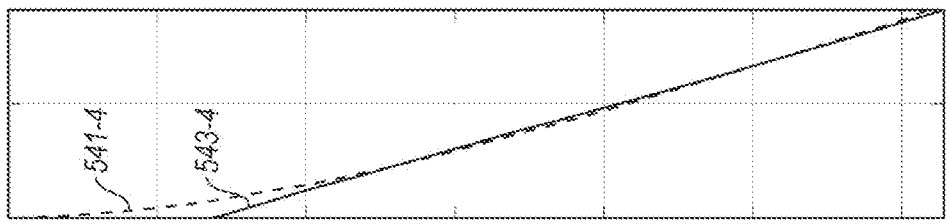
Figures 4, 5:
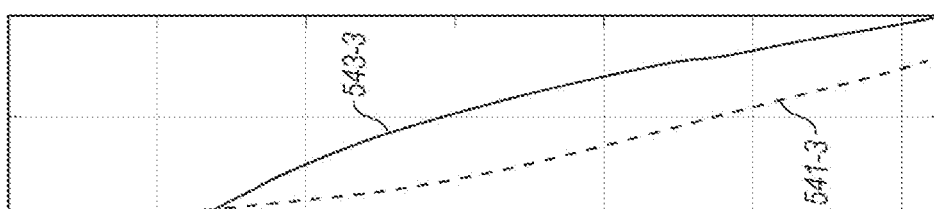
Figures 3, 5:
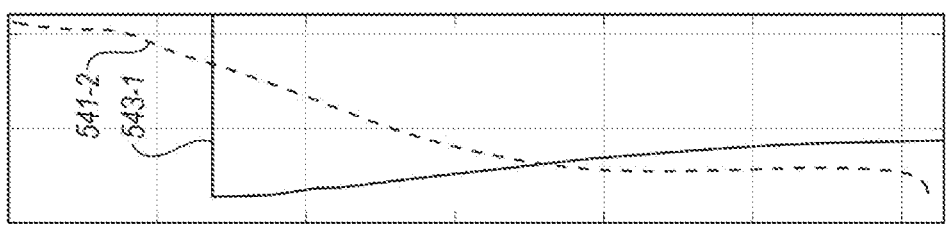
Figures 2, 5:
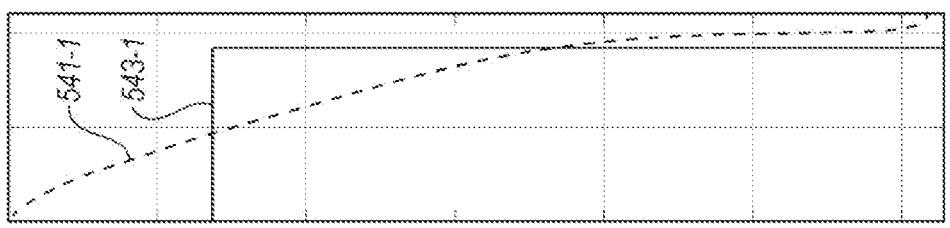

In some embodiments, the 90° continuous build may be developed using a Bézier curve, such as the Bézier curves (collectively 431) seen in FIG. 4-1 through FIG. 4-3. A Bézier curve is a flexible curve that has the potential to develop 90° continuous builds in both 2D and 3D spaces. Furthermore, Bézier curves may be calculated and used to develop trajectories in both pre-plan and real-time applications. In their simplest form, Bézier curves have four control points, two of them assigned to the starting (collectively 433) and ending (target) (collectively 435) positions, and the other two flexibly positioned along the starting (collectively 437) and ending tangents (horizons) (439). The distances of these third and fourth control points to the stationary ones are the design parameters.

In FIG. 4-1, a first Bézier curve 431-1 is developed using a first start point 433-1 and a first end point 435-1. A first start tangent 437-1 is offset from the first start point 433-1 and a first end tangent 439-1 is offset from the second start point 435-1. The shape of the curve between the first start point 433-1 and the first end point 435-1 may be adjusted by changing the position of the first start tangent 437-1 and/or the first end tangent 439-1. In this manner, the Bézier curve may be easily and quickly modified to produce a curve between the first start point 433-1 and the second start point 435-1.

For example, as may be seen in FIG. 4-2, the shape of the Bézier curve 431-2 is modified by extending the second start tangent 437-2 further away from the first start point 433-2, while the second end tangent 439-2 remains the same distance from the second end point 435-2. As may be seen in FIG. 4-3, the shape of the Bézier curve 431-3 may be further modified by extending the third start tangent 437-3 further away from the first start point 433-3, while the second end tangent 439-3 remains the same distance from the second end point 435-3.

In accordance with embodiments of the present disclosure the designed target trajectory (e.g., the trajectory paths described with respect to FIG. 3 through FIG. 4-3) may be compared with a similar trajectory produced using a conventional design methodology (e.g., based on the minimum curvature principle), in which the sections of trajectories are either straight lines, or circular arcs.

For example, as may be seen in FIG. 5-1, the designed target trajectory 541 (e.g., the upper) curve represents the optimal trajectory designed according to embodiments of the present disclosure. The minimum curvature trajectory 543 is based on the conventional minimum curvature principle. The T2T values can be estimated using the predicted ROP model shown in FIG. 5, which shows that the predicted T2T for the minimum curvature trajectory 543 is approximately 30% greater than that of the designed target trajectory 541.

FIG. 5-2 through FIG. 5-5 represent comparisons between the designed target trajectory 541 and the minimum curvature trajectory 543 for various drilling parameters plotted against measured depth (MD). As may be seen in FIG. 5-2, the DLS for the designed target trajectory 541-1 increases gradually, while the DLS for the minimum curvature trajectory 543-1 is constant but for an instantaneous jump at approximately 250 ft. MD. Similarly, the ROP shown in FIG. 5-3 decreases gradually for along the MD for the designed target trajectory 541-2, while the minimum curvature trajectory 543-2 instantaneously decreases at the same location as the DLS in FIG. 5-2. FIG. 5-2 and FIG. 5-3 indicate that designing a target trajectory according to embodiments of the present disclosure may develop a target trajectory that is smoother. This may be more representative of actual downhole conditions.

As may be seen, the modeled decrease in ROP for the designed target trajectory 541-3 is gradual. Thus, the total drilling time shown in FIG. 5-4 may gradually increase based on the ROP and the MD. In contrast, for the conventional minimum curvature trajectory 543-3, the total drilling time may increase faster after the instantaneous jump in DLS and corresponding drop in ROP. As may be seen in FIG. 5-5, the change in INC for the designed target trajectory 541-4 may be approximately the same as the change in INC for the conventional minimum curvature trajectory 543-4, but for where the change in INC begins for the respective curves. In this manner, the projected target T2T may be lower for the designed target trajectory 541 than for the minimum curvature trajectory 543. This may more accurately reflect actual drilling conditions, thereby allowing an operator to more accurately forecast drilling times, costs, and so forth.

In accordance with at least one embodiment of the present disclosure, the cost analysis for a target trajectory may be performed each time the target trajectory is calculated. In this manner, an operator may compare multiple different target trajectories and determine which target trajectory is the lowest cost (e.g., which target trajectory has the lowest total time to target, or lowest T2T). In some embodiments, to reduce the computing load, a comparison of one or more of the target drilling parameters with the DLS and INC may be pre-calculated and/or pre-determined. After preparing the target trajectory, the DLS and INC from the target trajectory may be compared to the pre-calculated drilling parameters. In this manner, the cost of the target trajectory may be determined using a look-up table, a chart, a graph, or other look-up information, rather than a calculation. This may save computing resources and time. In some embodiments, modifications to a target trajectory may be made while drilling the wellbore, and the modifications may be compared to the pre-calculated comparisons in real-time. This may improve the responsiveness of drilling control systems, allowing changes to a drilling trajectory to be effectively analyzed before being implemented by a drilling operator.

Predicting Drilling Tool Behavior by Physical and Machine Learning Modelling

Figure 6:
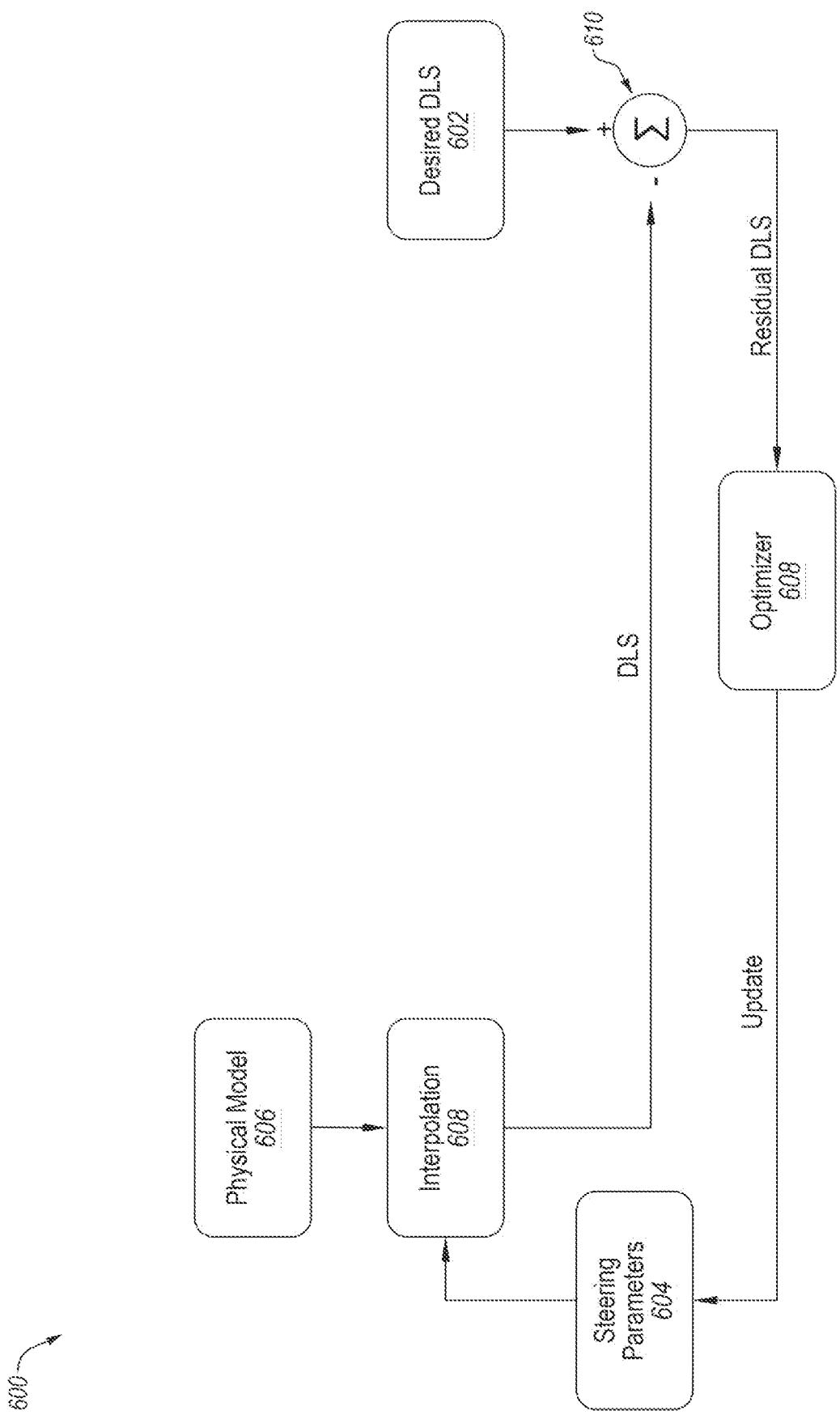
FIG. 6 is a flow chart of a method for optimizing the steering (drilling) parameters to achieve a dogleg severity that is as closed as possible to a desired value, based on a physics-based model, according to some embodiments of the present disclosure.

FIG. 6 illustrates an example of a method 600 for predicting drilling tool behavior by PBM and ML. The method 600 may be implemented by a wellbore planning system, which may include one or more surface computing devices, downhole computing devices, remote computing devices, cloud computing devices, and so forth. The prediction provided by the method 600 may be used to determine how a particular drilling tool may perform based on a proposed target trajectory. The method 600 is illustrated in the form of a feedback control loop, and shows the process for a given INC for the trajectory. In accordance with embodiments of the present disclosure, the method 600 may determine and/or predict what range of DLSs that are achievable (e.g., what is the range of achievable dogleg severity) at the given INC value and what steering parameters may be used to achieve each feasible DLS level. In some embodiments, if there is more than one set of steering parameters possible to arrive at the combination of INC and DLS, the ROP values can be considered and potentially the set of parameters leading to the highest ROP can be selected.

In the method 600, for a particular trajectory INC, and given a particular DLS at 602, optimal steering parameters for the combination of INC and DLS may be found at 604. Such parameters can include, for example, surface WOB (SWOB), flow rate (FLWI), surface rotational speed (RPMS), steering ratio (SR), and toolface (TF), any other drilling parameter, and combinations thereof. In some cases, the parameters may be variable. For example, the parameters may be changed during drilling operations. In other cases, fixed values may be provided (e.g., FLWI may be pre-defined). Using these parameters, the method may predict a predicted DLS. In some embodiments, the acts of the method 600 may be repeated, iterated, or looped until the predicted DLS is equal to, or as close as possible to, the desired DLS 602.

At a given iteration of the optimization loop, the current best estimate of the p steering parameters is provided at 604. For the initial calculation of the loop, an operator may provide steering parameters at 604 that may represent previous drilling conditions from an offset wellbore. For subsequent calculations of the loop, the current best estimate may be provided by the results from the previous iteration. A physical model of the formation provided at 606 may be represented as a multidimensional cube, where the DLS level is estimated, given the values of the steering parameters. Since these values can take on discrete values, a multidimensional interpolation procedure at 608 is used to determine a predicted DLS value predicted by PBM. The difference between the desired DLS and the predicted DLS values may be determined as a residual at 610, and an optimizer (or solver) 612 uses the residual DLS to produce and update the current values of the steering parameters at 604.

In accordance with embodiments of the present disclosure, the loop of the method 600 may be repeated or iterated until an end condition is realized. For example, an end condition may be when the predicted DLS converges with the desired DLS (e.g., when the difference between the predicted DLS is less than 5%, less than 2.5%, less than 1%, less than 0.5%, less than 0.1%, or any value therebetween of the desired DLS). Put another way, the method 600 may be iteratively repeated until the predicted DLS converges with the desired DLS. In some examples, an end condition may be when a pre-determined number of iterations have been performed. In some examples, an end condition may be when subsequent iterations result in small or no changes to the predicted DLS (e.g., subsequent iterations of the predicted DLS are less than 5%, less than 2.5%, less than 1%, less than 0.5%, less than 0.1%, or any value therebetween, different than the previous predicted DLS). When the iterations converge (or another end condition is realized), the optimal values of the predicted steering parameters, as well as the closest feasible value of DLS to the desired level, may be retrieved at 604. In this manner, the method 600 may help to optimize steering parameters based on a target or desired DLS. This process may be repeated multiple times for multiple INT and/or desired DLS values. The target trajectory may then be compared to these results to determine the parameters at any given location on the target trajectory.

Figure 7:
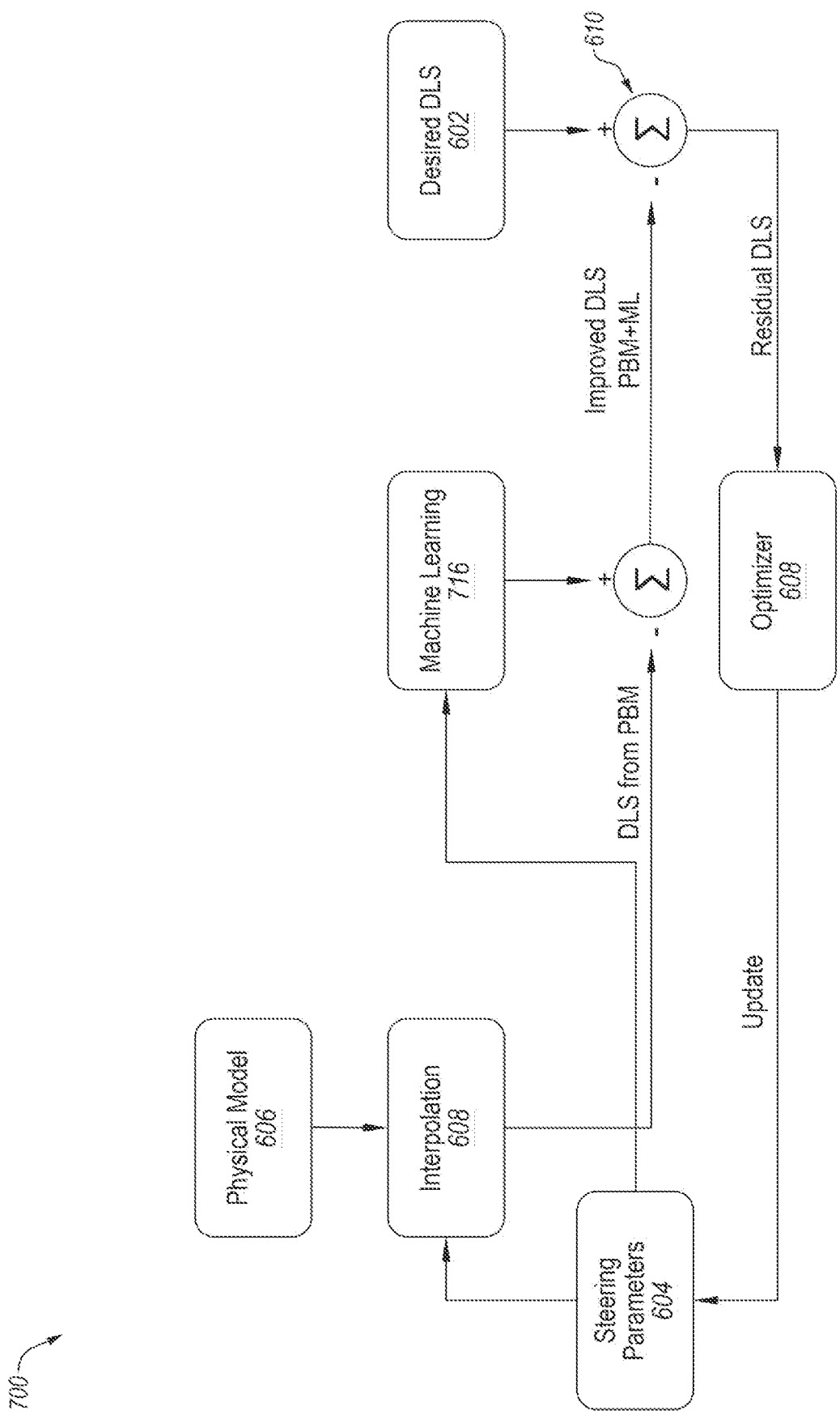
FIG. 7 is a flow chart of a method similar to the method of FIG. 6, but also providing the DLS estimate by correcting the physics-based model estimate by an amount determined by machine learning, according to some embodiments of the present disclosure.

The accuracy (or fidelity) of the method described in FIG. 6 may be increased in some embodiments by taking into account observed or real-world data, including data collected from offset wells, such as observed or measured steering parameters, observed or measured DLS, ROP, INC, any other data, and combinations thereof. FIG. 7 shows an example method 700 that uses offset well data. In accordance with embodiments of the present disclosure, the predicted DLS provided by PBM modelling 606 and interpolation at 608 can be corrected at 314. The corrected DLS may include input from a Gaussian process prediction or another suitable machine learning (ML) process 716. The ML process 716 may receive input from the steering parameters 604. The ML process 716 may be previously trained to predict DLS values based on observed DLS values associated with observed steering or other drilling and wellbore parameters. The ML process 716 may provide a DLS correction, which may modify the predicted DLS, resulting in a revised DLS estimate based on the PBM as revised by the ML process 716. As described above with respect to FIG. 6, the method 700 may be repeated until an end condition is reached, such as convergence of the revised DLS and the desired DLS, a pre-determined number of iterations, small or no changes to the revised DLS, any other end condition, and combinations thereof.

Figure 8:
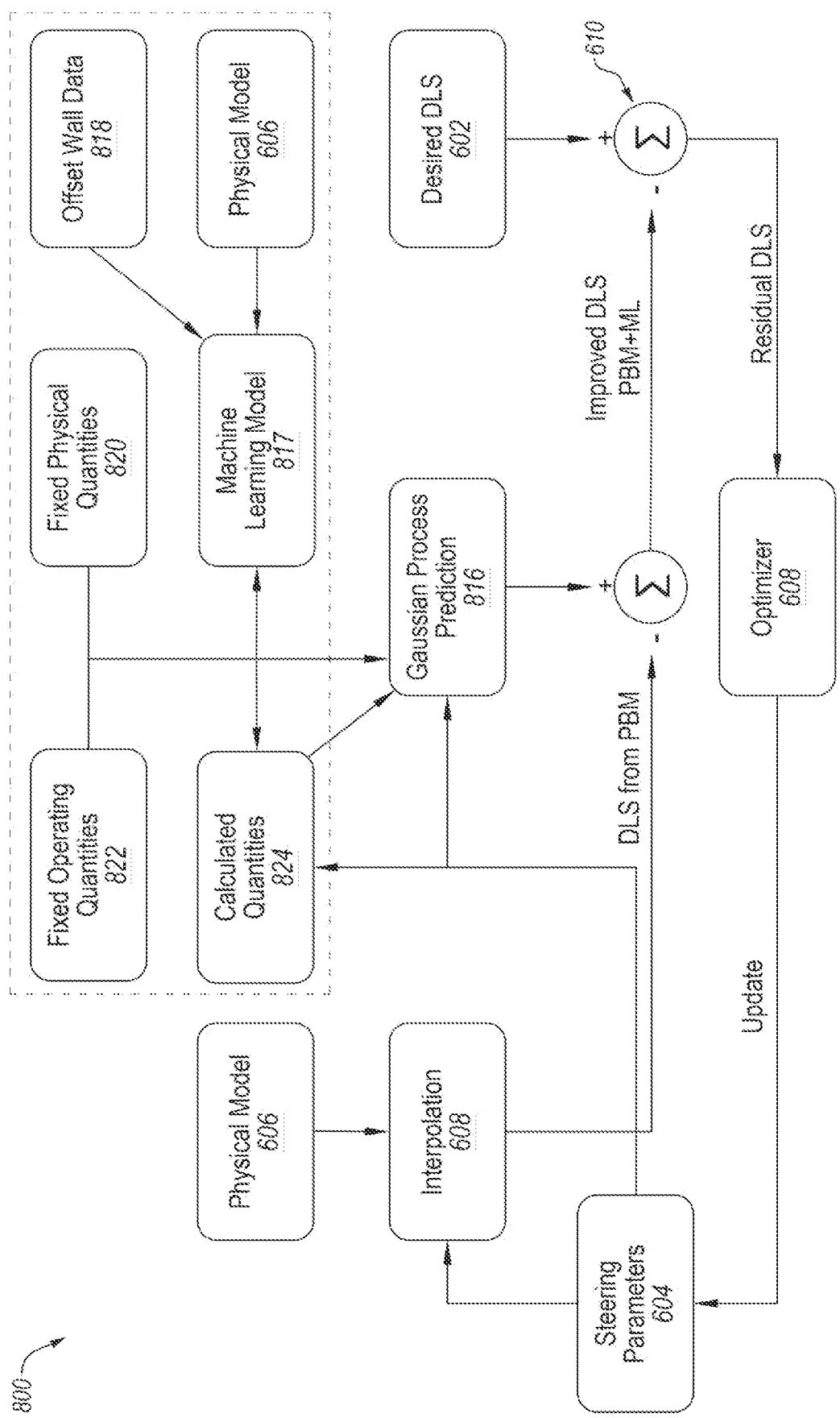
FIG. 8 is a flow chart of a method similar to the method of FIG. 7, but including inputs that are used in building the physics-based and machine learning models, according to some embodiments of the present disclosure.

FIG. 8 shows a method 800 similar to method 700 described in FIG. 7, with some additional detail. Gaussian process prediction 816 uses several inputs, including an ML (e.g., Gaussian) process model 817 that is built and/or trained prior to the application of this method. In some embodiments, the ML process model 817 may be trained using the physical model produced by the PBM modeling 606, offset well data (and/or data from the current well) 818, fixed and calculated quantities of drilling parameters, any other data, and combinations thereof. The fixed quantities may include fixed physical quantities 820, which can include, for instance, mechanical specific energy (MSE), formation top (FT) positions, location, any other fixed physical quantities 820, and combinations thereof. Further fixed quantities can include operating quantities 822 such as INC, revolutions per gallon (RPG), BHA design and parameters, the mud weight (MudWt), any other operating quantities 822, and combinations thereof. In the embodiment shown, these further fixed quantities 820, 822 are also used in building the physical model.

In some embodiments, one or more calculated quantities 824 may be calculated or produced from the fixed quantities (e.g., the fixed physical quantities 820 and/or the fixed operating quantities 822) and the steering parameters provided at 604. The calculated quantities may include quantities such as ROP, total RPM (RPMT), resultant force (ResForce), any other calculated quantity 824, and combinations thereof. According to one embodiment, various calculated quantities 824 are computed as follows:

$$RPMT = RPMS + RPG \cdot FLWI \qquad \text{EQ. 1}$$

$$ResForce = MudWt \cdot [c_1 + c_2 \cdot RPMT + c_3 \cdot (RPMT)^2 + c_4 \cdot FLWI + c_5 \cdot (FLWI)^3] \qquad \text{EQ. 2}$$

$$ROP = SWOB \cdot RPMT / MSE \qquad \text{EQ. 3}$$

The variables $c_1$, $c_2$, $c_3$, $c_4$, and $c_5$ are constants that depend on the well that is being drilled/constructed. It will also be appreciated in view of the disclosure herein that a relationship in Equation 3 which predicts the ROP from the current estimates of the steering parameters can be replaced by any other suitable ROP model generated for this or other purposes.

In FIG. 8, the units that are within the dashed box are largely related to the building of the physical and ML models, whereas the units that are outside the dashed box are largely related to the application of the learned models.

In some embodiments, when the optimization iterations converge (or are otherwise concluded, such as by completing a fixed number of iterations, or little or no change in calculated values), there may be certain quantities that reviewed and potentially critical to the optimization of the wellbore trajectory. For instance, any or all of the steering parameters calculated at 604 may be critical to the optimization of the wellbore trajectory. Thus, the optimization iterations may compare the calculated steering parameters to desired or target steering parameters. Other parameters may include the refined DLS calculated in the correction at 714 that is the closest to the desired DLS at 602, and the corresponding resulting ROP in the calculated quantities at 824. In accordance with embodiments of the present disclosure, the method 800 may be performed for a given value of INC in the fixed operating quantities 822.

In at least some embodiments, the method 800 of FIG. 4 can include any combination of one or more of various acts. An example act can include, for instance, for a trajectory at a given INC to identify a given DLS for continued drilling. A determination can also be made as to what steering parameters (e.g., SWOB, FLWI, RPMS, SR, and TF) should be. Such parameters may be determined by optimization. For instance, for each corresponding candidate INC value, an initial estimate of DLS can be estimated using PBM by using some or all of the desired parameters (e.g., SWOB, FLWI, and RPMS) through interpolation. RPMT can be computed from FLWI and RPMS, and optionally using RPG for certain embodiments. ResForce can be computed from RPMT and FLWI, and optionally using MudWT for certain embodiments. ROP can be computed from SWOB and RPMT, and optionally using MSE for certain embodiments. Using machine learning processes (e.g., Gaussian process regression), a prediction can be made to correct the DLS from the PBM. This ML process may lean from offset-well data, as well as various physical or operating parameters (e.g., ResForce, ROP, RPMT, FLWI, SWOB, MSE, and current INC). Optimal values of parameters (e.g., SWOB, FLWI, RPMS, SR, and TF) can also be found so that the corrected DLS (PBM+ML) is closest to the desired DLS. The corresponding ROP for each set of parameters and DLS can also be computed.

Full Characterization of the Drilling Tool

Using the hybrid modelling approach (e.g., PBM+ML) described in FIGS. 7 and 8, the ROP and optimal steering parameters can be computed for each desired DLS and each INC. By way of example, this may include computing INC for all degrees between a minimum and a maximum wellbore inclination of 0° and 90° (e.g., in increments that may include 0.05°, 0.1°, 0.5°, 1°, 5°, or any value therebetween). In some embodiments, the INC may be in a range having an upper value, a lower value, or upper and lower values including any of 0°, 1°, 5°, 10°, 20°, 30°, 40°, 50°, 60°, 70°, 80°, 90°, or any value therebetween. For example, the INC may be greater than 0°. In another example, the INC may be less than 90°. In yet other examples, the INC may be any value in a range between 0° and 90°.

This may also include computing all DLS between a minimum and a maximum DLS, including a minimum DLS of 0°/100 ft. and a maximum DLS of 24°/100 ft. (again in any suitable angular increment as noted above). In some embodiments, the DLS may be in a range having an upper value, a lower value, or upper and lower values including any of 0/100 ft., 2/100 ft., 4/100 ft., 6/100 ft., 8/100 ft., 10/100 ft., 12/100 ft., 14/100 ft., 16/100 ft., 18/100 ft., 20/100 ft., 22/100 ft., 24/100 ft., or any value therebetween. For example, the DLS may be greater than 0/100 ft. In another example, the DLS may be less than 24/100 ft. In yet other examples, the DLS may be any value in a range between 0/100 ft. and 24/100 ft.

Using the PBM+ML optimization, the closest achievable DLS is predicted, for optimal values of steering parameters such as SWOB, FLWI, RPMS, SR, and TF. The resulting ROP can also be predicted. The predicted ROP and other steering parameters may then be plotted with respect to DLS and INC, as may be seen with respect to FIG. 9 through FIG. 14. In some cases, the uncertainty of the predicted DLS correction to the PBM can be calculated.

Figure 9:
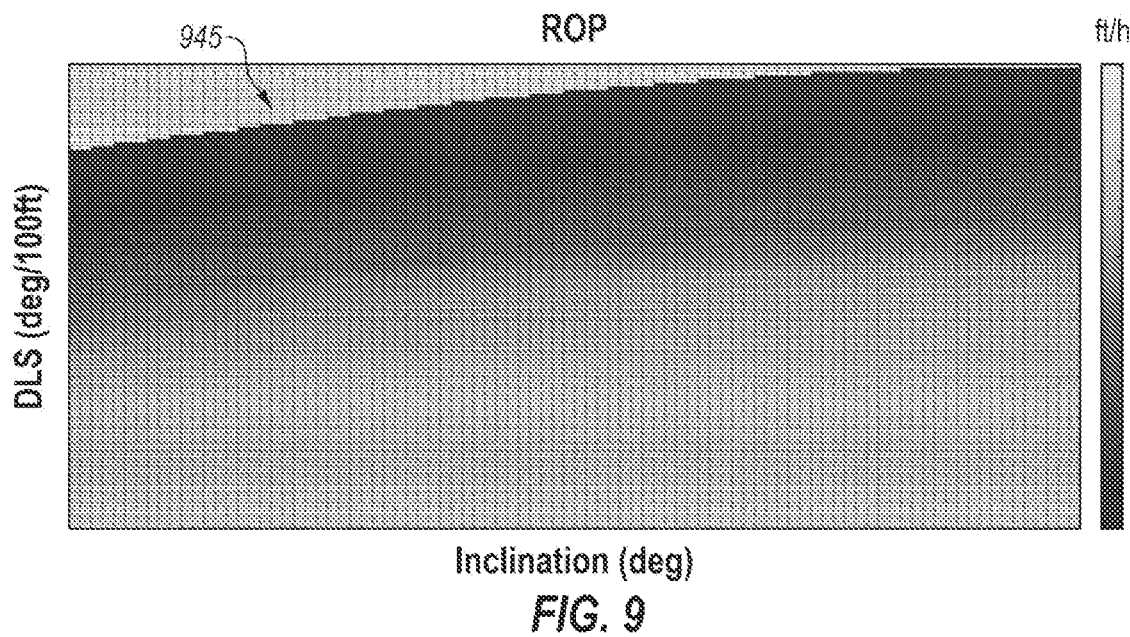
FIG. 9 is a chart of optimal values of the drilling parameter rate of penetration as a function of dogleg severity and inclination, according to some embodiments of the present disclosure.

In certain embodiments, DLS_max may be a value between 8°/100' and 24°/100'. For instance, DLS_max may be between 10°/100' and 20°, or between 12°/100' and 16°/100'. FIGS. 9 to 15 show examples of some illustrative numerical examples and results after following a method of FIG. 7 or 8. For instance, FIG. 9 shows the ROP (scale at the right) as a function of DLS (y-axis) and INC (x-axis), after the iterations of the method 800 of FIG. 4 are concluded. As may be seen, each DLS and INC value may have an associated ROP except in an un-drillable area 945, which may be where the plot is blank. In the un-drillable area 945, the drilling assembly may not be able to effectively drill at that combination of DLS and INC. Put another way, in the un-drillable area, the DLS may be greater than a predicted maximum feasible DLS for a given INC. Using the ROP and other drilling parameter models shown, a drilling operator may be able to find or determine the optimal trajectory design based on predicted tool performance, as described herein. In the ROP model shown in FIG. 9, ROP increases with decreasing DLS for all inclinations. Surprisingly, the maximum feasible DLS value increases as a function of INC.

Figure 10:
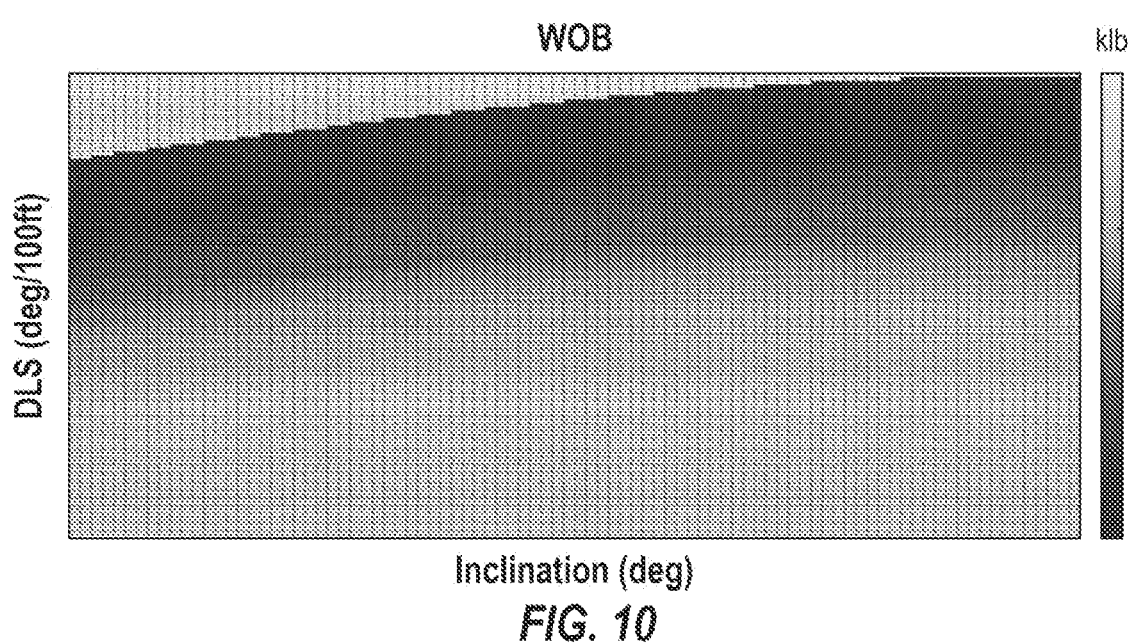
FIG. 10 is a chart of optimal values of the drilling parameter weight-on-bit as a function of dogleg severity and inclination for the predicted rate of penetration model of FIG. 9, according to some embodiments of the present disclosure.
Figure 11:
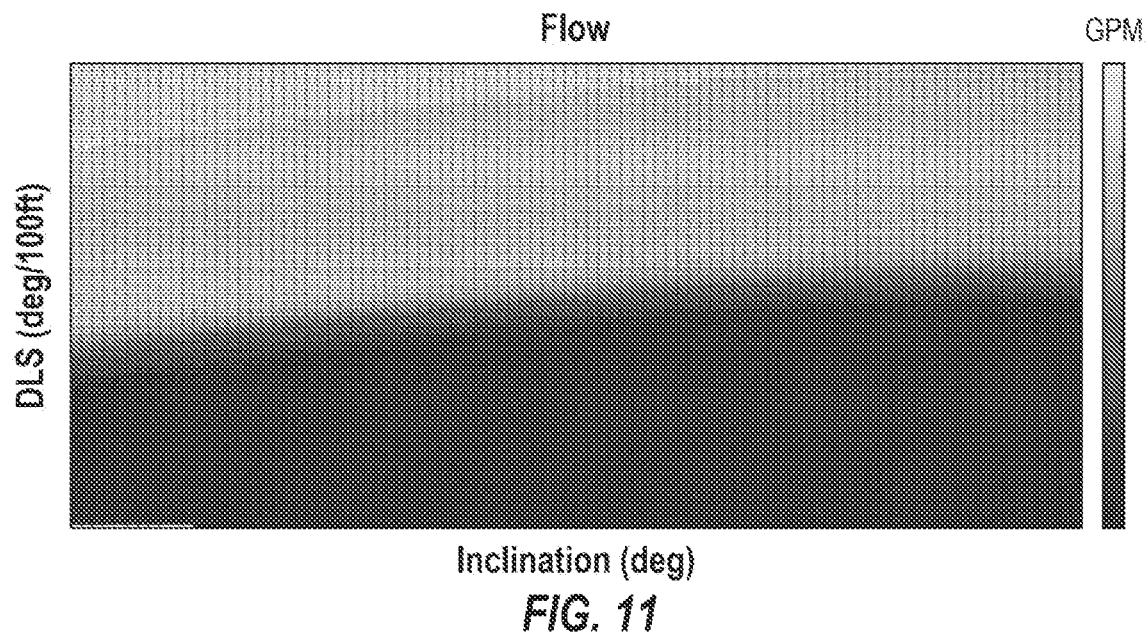
FIG. 11 is a chart of optimal values of the drilling parameter flow rate as a function of dogleg severity and inclination for the predicted rate of penetration model of FIG. 9, according to some embodiments of the present disclosure.
Figure 12:
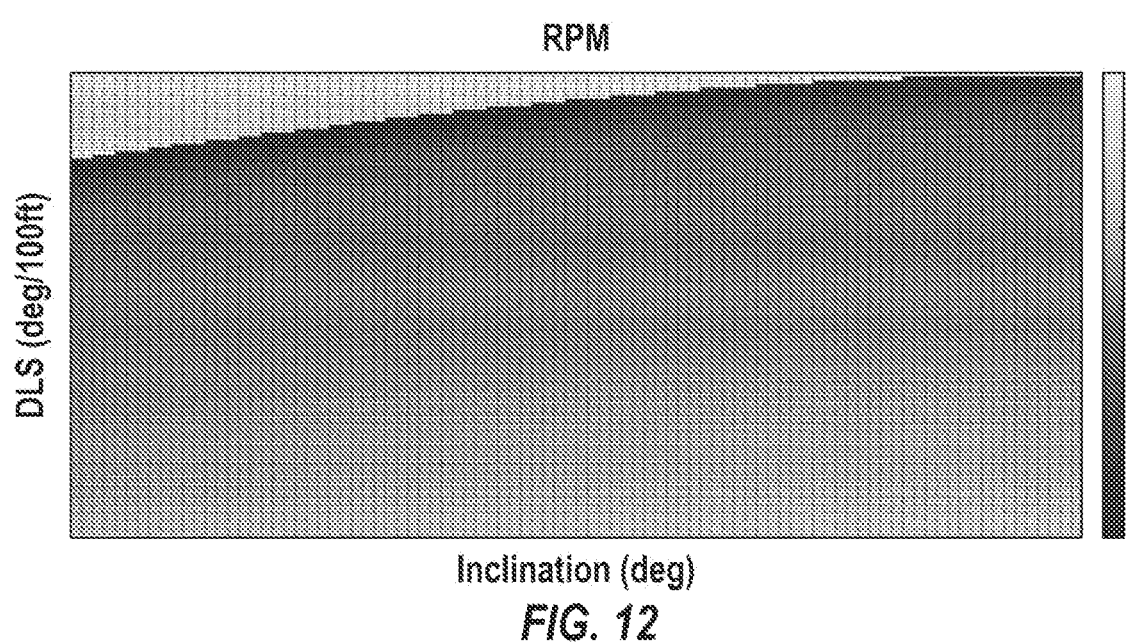
FIG. 12 is a chart of optimal values of the drilling parameter steering ratio as a function of dogleg severity and inclination for the predicted rate of penetration model of FIG. 9, according to some embodiments of the present disclosure.
Figure 13:
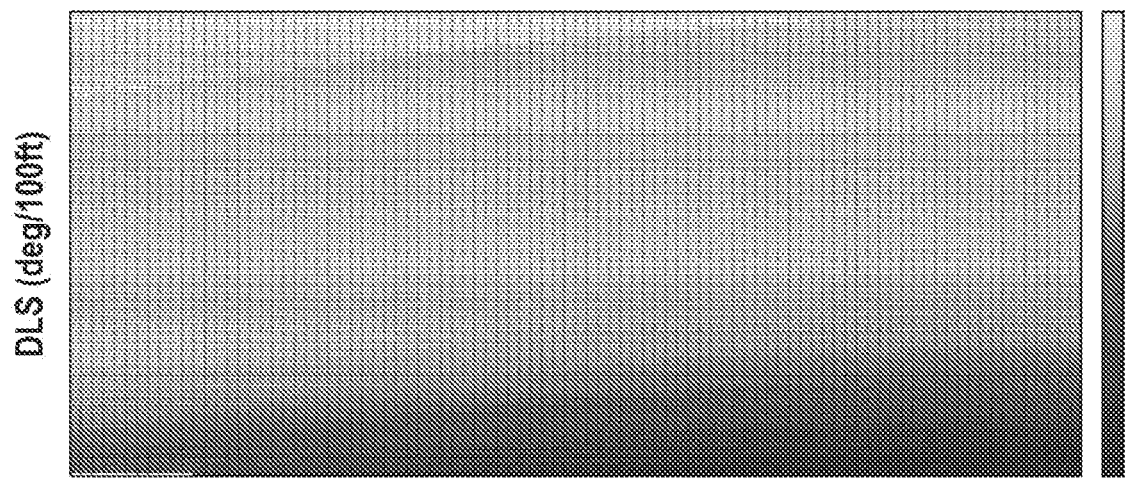
FIG. 13 is a chart of optimal values of the drilling parameter weight-on-bit as a function of dogleg severity and inclination for the predicted rate of penetration model of FIG. 9, according to some embodiments of the present disclosure.

FIG. 10 is a representation of the calculated WOB for a given combination of INC and DLS. As may be seen in a comparison between FIG. 9 and FIG. 10, the optimal WOB for a given DLS and INC combination may be associated with the highest ROP. FIG. 11 is a representation of the optimal fluid flow for a given INC and DLS combination. FIG. 12 is a representation of the RPM for a given INC and DLS combination. The steering ratio for each INC and DLS combination is shown in FIG. 13. A set of drilling parameters may be retrieved at any given combination of INC and DLS, including the ROP from FIG. 9, the WOB from FIG. 10, the fluid flow from FIG. 11, the RPM from FIG. 12, and the steering ratio from FIG. 13. In this manner, a drilling operator may utilize the charts from FIG. 9 through FIG. 13 to determine the optimum drilling parameters for a particular target trajectory or determine the optimum trajectory from a set of target trajectories.

Figure 14:
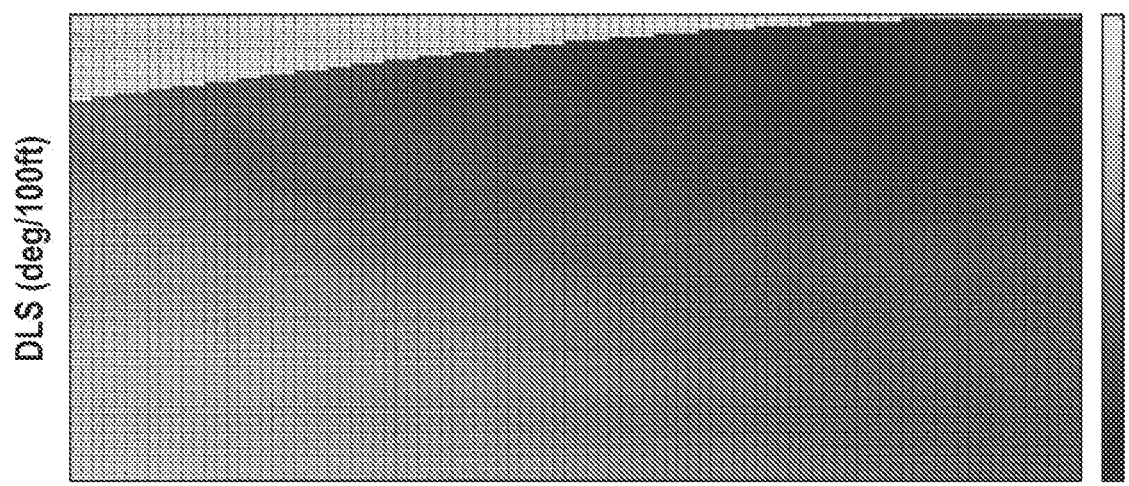
FIG. 14 is a chart showing machine learning correction to predicted dogleg severity predicted by a physics-based model, and corresponds to the predicted rate of penetration model of FIG. 5, according to some embodiments of the present disclosure.
Figure 15:
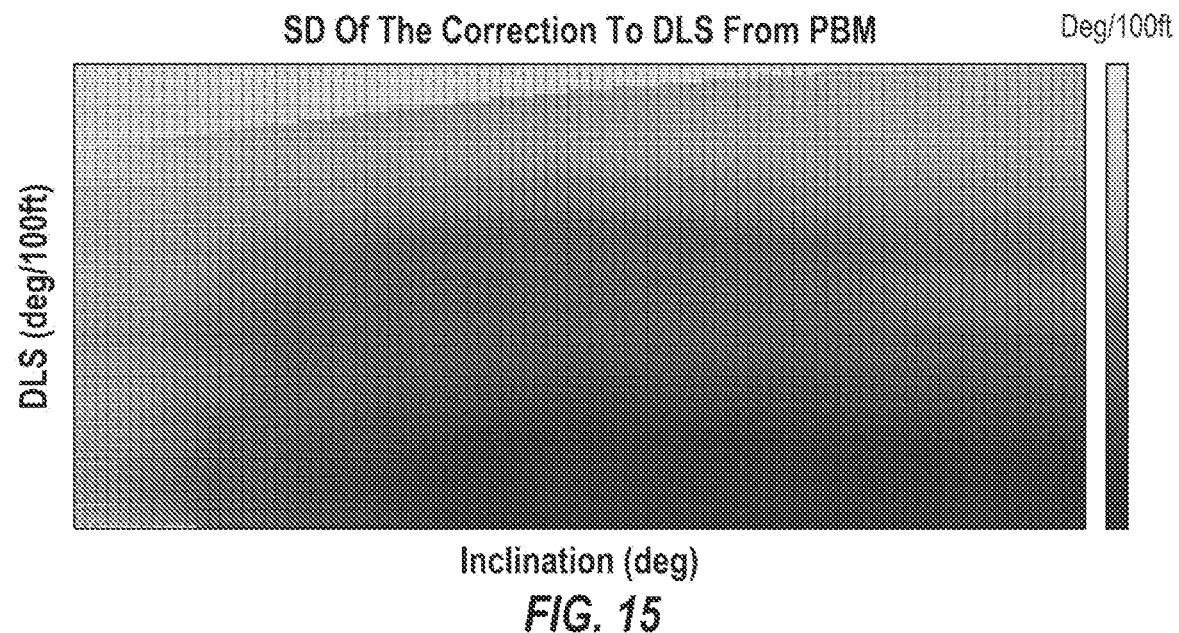
FIG. 15 is a chart showing standard deviation of the corrections of FIG. 14, and corresponds to the predicted rate of penetration model of FIG. 5, according to some embodiments of the present disclosure.

For each feasible DLS value and INC, FIG. 14 shows correction to the predicted DLS from PBM that was provided by ML from FIG. 7 and FIG. 8. This may allow a user to determine how sensitive the predicted DLS may be, based on the INC. This may allow the user to determine how much of the trajectory from the original model was changed. FIG. 15 shows the standard deviation of the correction to the DLS at a given inclination. This may provide the user with an indication of the uncertainty in the DLS estimations. For example, the top right and the top left portion of FIG. 15 have the highest standard deviations of the corrected DLS. This may indicate that the DLS in those regions may be more uncertain than a DLS from the central portion of the plot.

Trajectory Design that Optimally Uses Predicted Tool Performance

Once the predicted ROP performance of the tool is available as discussed above, the design of an optimal trajectory may proceed. FIG. 9, in particular, summarizes an example ROP model that was derived by PBM followed by ML prediction.

To optimize the target trajectory, a multitude of candidate trajectories may be created. After analyzing each of the target trajectories, the user may choose from amongst them the optimal one, according to some criterion. An example of such criterion would be to minimize the total drilling time-to-target (T2T). This can generally be seen to correspond to the integral of the ROP profile along the trajectory. The multiple trajectories may be created in any manner. For example, each trajectory may be formed using the generalized superellipse, the Bézier curve, any other mechanism, minimum curvature, and combinations thereof.

Figure 16:
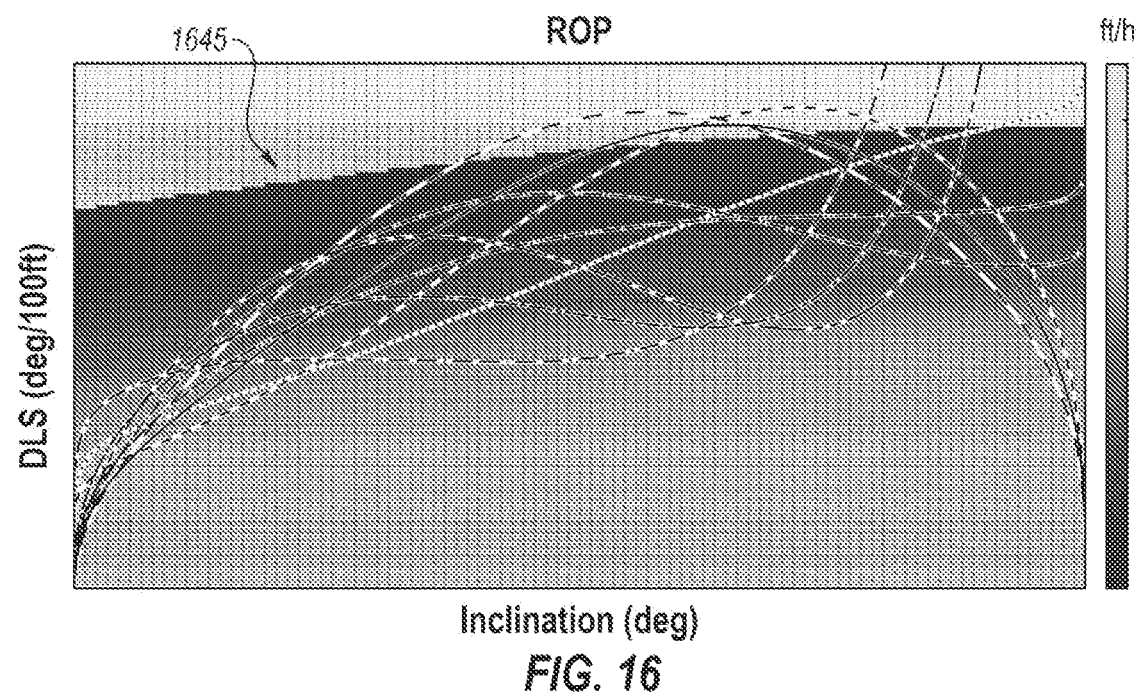
FIG. 16 is a predicted rate of penetration profile for the nine trajectories of FIG. 3, according to some embodiments of the present disclosure.

Once the plurality of target trajectories has been generated, the trajectories may be plotted on a steering parameter plots, such as the steering parameter plots described with respect to FIG. 9 through FIG. 13. FIG. 16 is a representation of the ROP plot with respect to DLS and INC from FIG. 9 with a plurality of overlaid target trajectories. In the embodiment shown, the overlaid trajectories may be the trajectories for the 90° continuous build shown in FIG. 3. The trajectories may be plotted by inputting the INC and DLS for each portion of the trajectory on the plot. By analyzing the overlaid plot of FIG. 16, a user may determine the optimal target trajectory. For example, the user may select a selected target trajectory based on any parameter, including a minimized T2T.

In some embodiments, any trajectory that extends into the un-drillable area 1645 (e.g., the portion of the plot for which the drilling assembly is not designed or configured to drill) may be dismissed as a non-drillable trajectory. As may be seen, of the trajectories shown on FIG. 16, only a first target trajectory 1647-1 and a second target trajectory 1647-2 may be drillable trajectories. The optimum trajectory of these two trajectories may then be determined, such as by determining the T2T for each trajectory by integrating under each trajectory. In the embodiment shown, the first target trajectory 1647-1 may have the smallest T2T, and therefore may be the optimized target trajectory.

Figure 17:
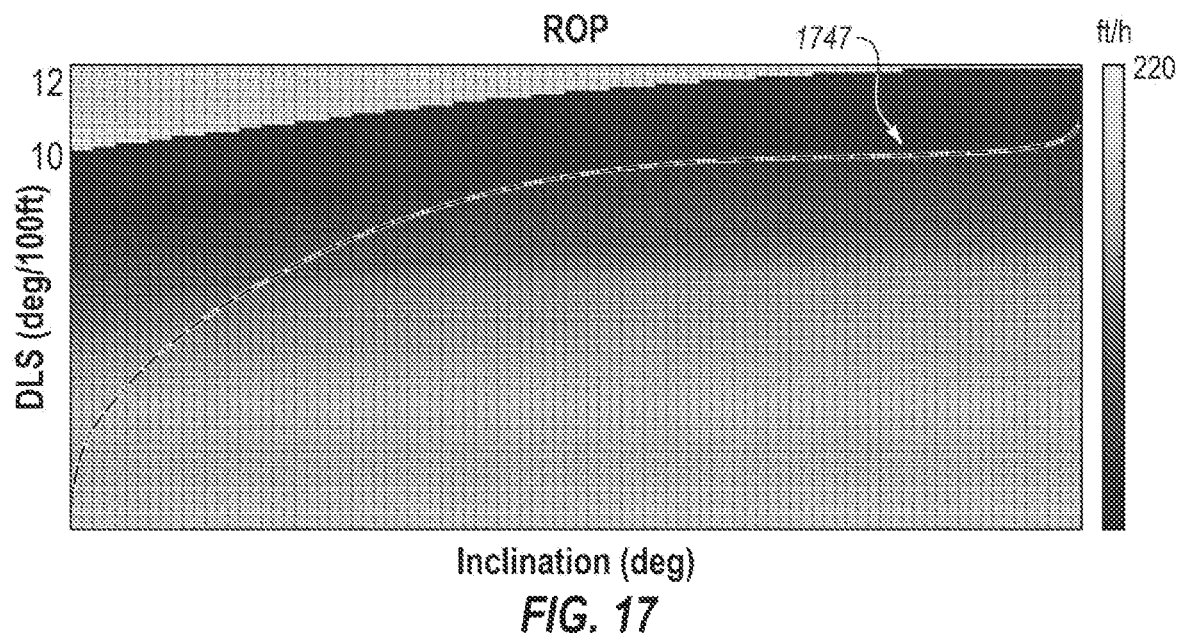
FIG. 17 is a rate of penetration profile of the optimal trajectory of FIG. 3, according to some embodiments of the present disclosure.
Figures 1, 18:
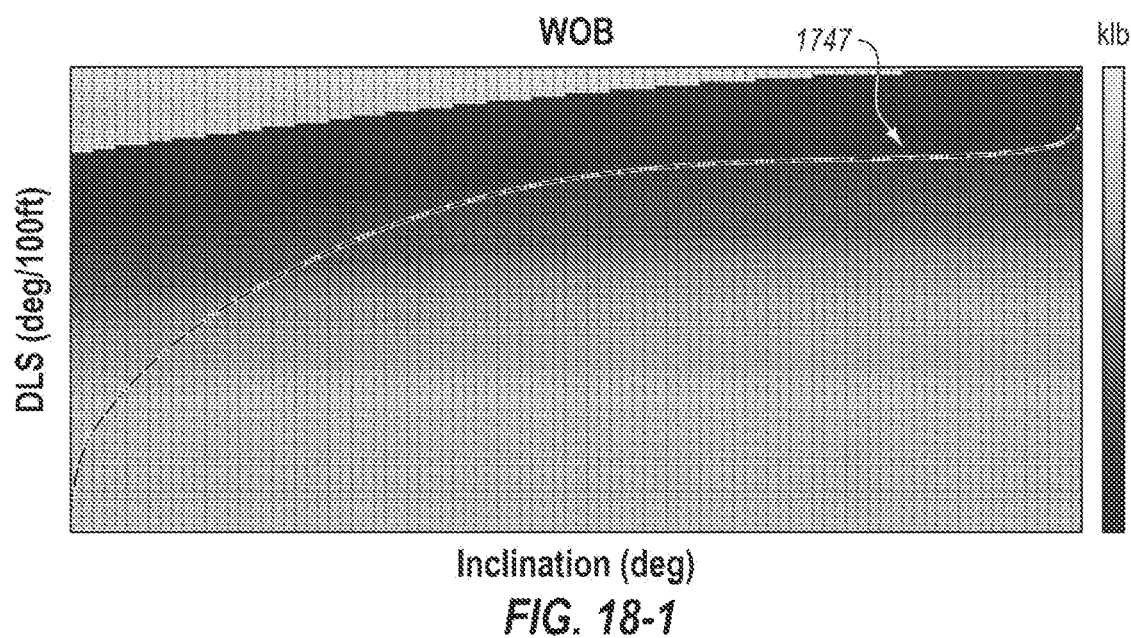
Figures 2, 18:
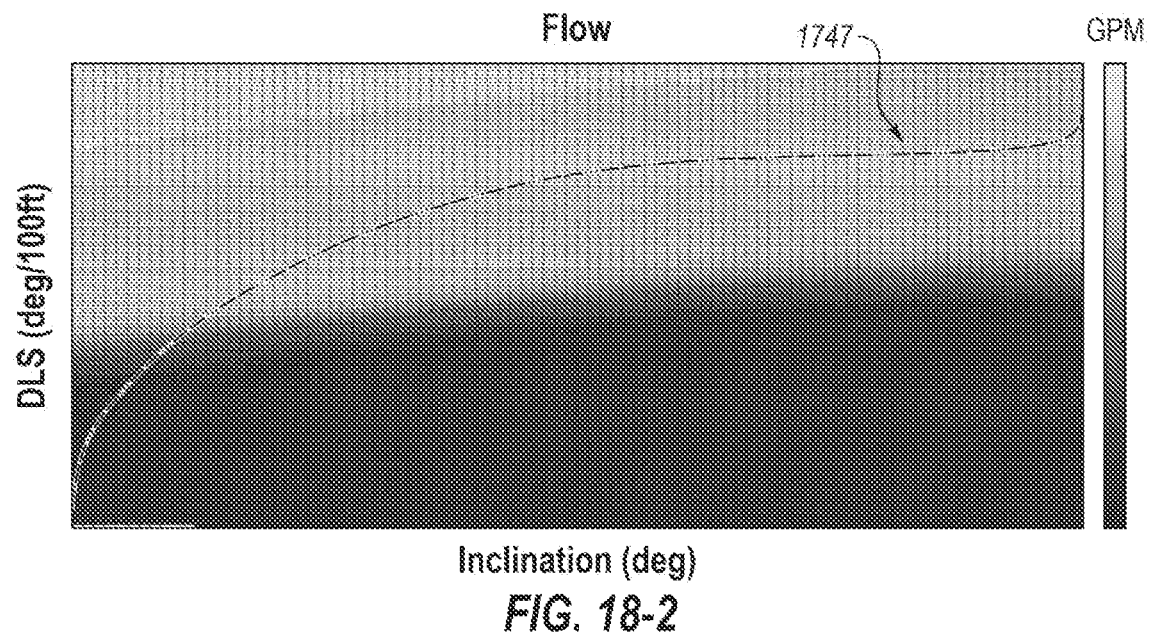
Figures 3, 18:
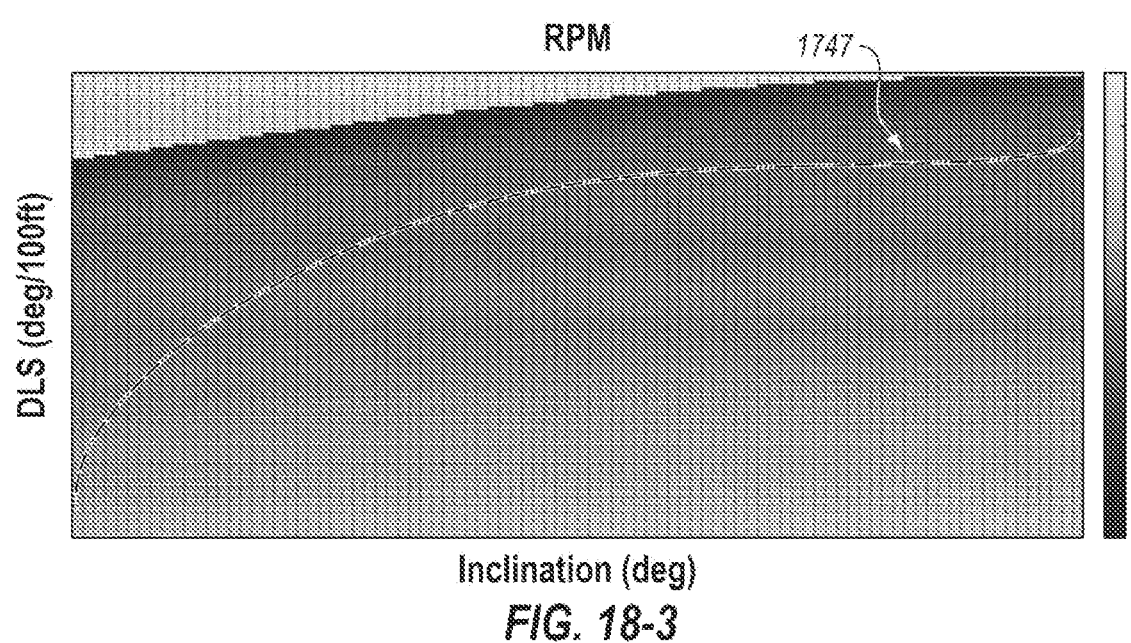
Figures 4, 18:
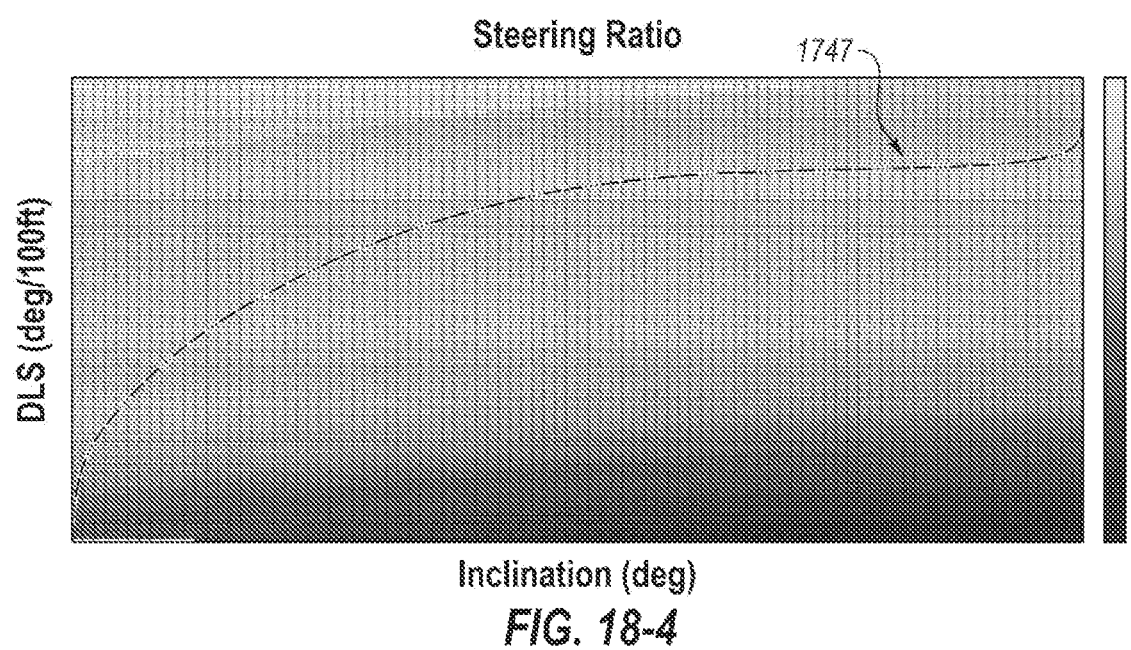

FIG. 17 is a representation of the ROP plot from FIG. 16 with the optimum target trajectory 1747 plotted on it. As discussed herein, the total T2T may be determined by integrating the optimum target trajectory 1747 on this plot. FIG. 18-1 through FIG. 18-4 are representations of the optimum target trajectory 1747 overlaid over a drilling parameter plot. In FIG. 18-1, the optimum target trajectory 1747 is overlaid on the WOB plot from FIG. 10. In FIG. 18-2, the optimum target trajectory 1747 is overlaid on the flow rate plot from FIG. 11. In FIG. 18-3, the optimum target trajectory 1747 is overlaid on the RPM plot from FIG. 12. In FIG. 18-4, the optimum target trajectory 1747 is overlaid on the steering ratio plot of FIG. 13. When planning a wellbore, the drilling operator may, for each INC and DLS of the optimum target trajectory, determine the optimum drilling parameters. This may provide the drilling operator with a detailed drilling plan that may help to optimize the ROP and T2T of the optimum target trajectory.

As discussed herein, by plotting the target trajectories on a pre-calculated plot of a drilling parameter with respect to DLS and INC, the determination of an optimum trajectory may be greatly increased. This may be because the comparison between the drilling parameter and the target trajectory may be a plot comparison and/or a look-up table, rather than a lengthy, processor-intensive calculation. Thus, utilizing the drilling parameter plots, as discussed herein, may allow the user to quickly and easily determine the optimum target trajectory.

Expanding Set of Reachable Target Positions by Defining an Extended ROP Model

Figures 1, 19:
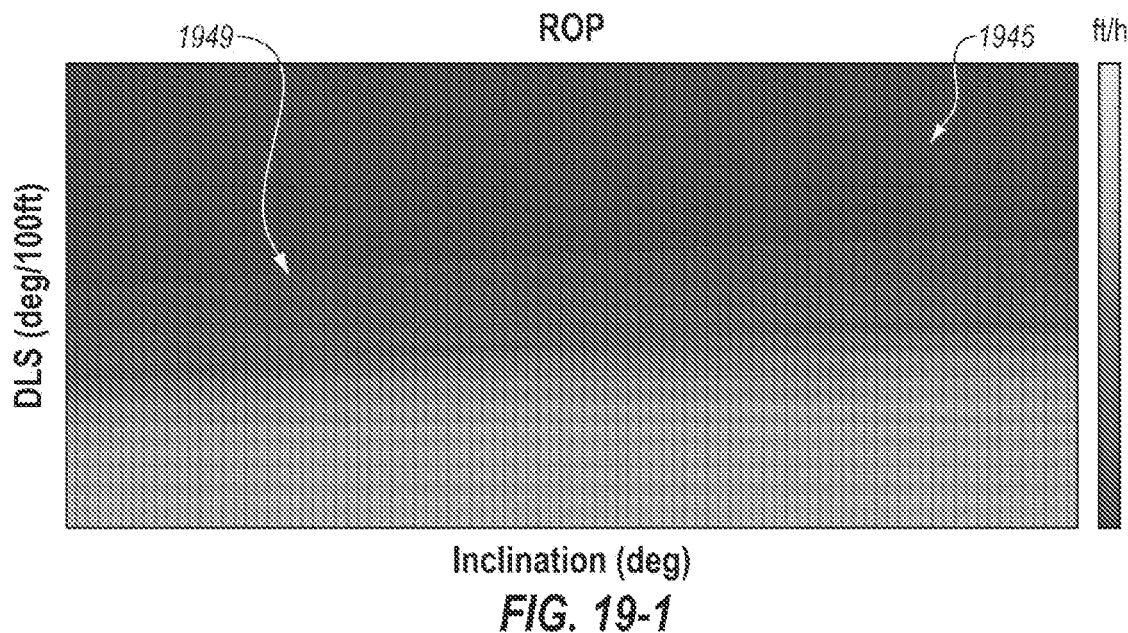
Figures 2, 19:
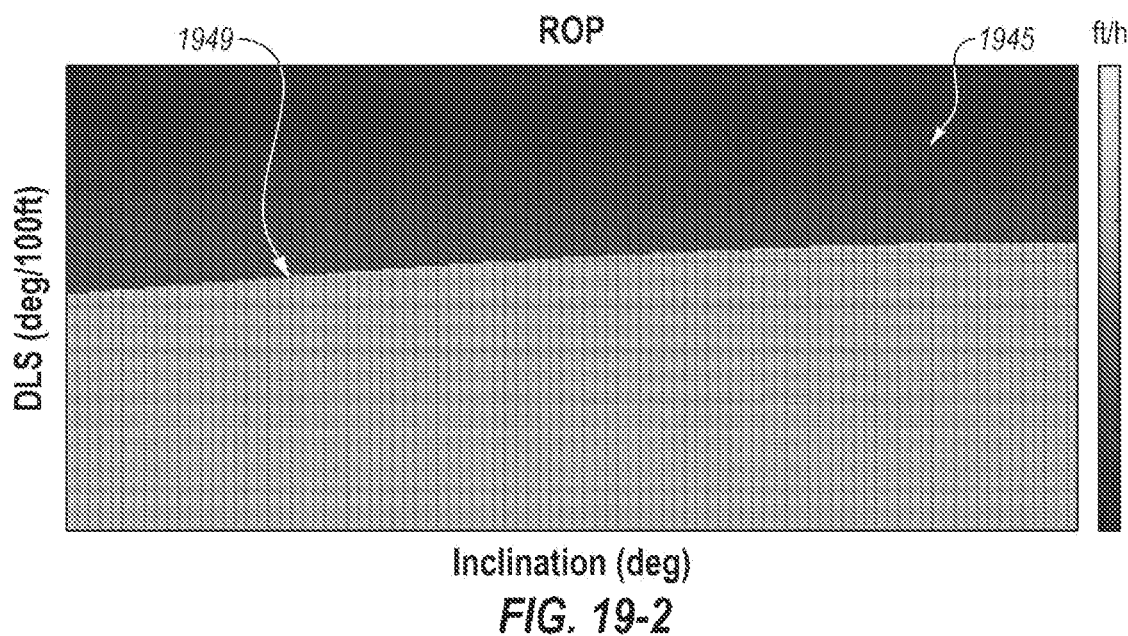

If the plot of the predicted ROP model as a function of DLS and INC is considered (as in FIGS. 9 and 16), there may be a domain at high DLS values that corresponds to infeasible operating conditions (e.g., the un-drillable zone 1645). In some embodiments, the ROP model of the present disclosure may be modified so that beyond the DLS upper limit for feasibility, changes of the INC value and/or the ROP may be identified as a very low ROP. For example, the ROP may be defined by a function that rapidly declines as a function of DLS. This may help to prevent errors in calculation by providing very low ROP values for un-drillable conditions. For example, as may be seen in FIG. 19-1, any combination of DLS and INC that is determined above an un-drillable line 1949 (e.g., within an un-drillable zone) may be provided a "pseudo ROP," or an artificially low ROP that is effectively zero (e.g., the pseudo ROP that declines or sharply as a function of DLS). Any target trajectory that plots into the un-drillable zone 1945 may return a very high T2T, and therefor may be dismissed. In FIG. 19-2, for low ROP areas, the un-drillable line 1949 may be sharply defined, and may halve or more the ROP in the un-drillable zone 1945.

Using this insight, an optimization strategy for the trajectory parameters within the scope of the present disclosure can include: (a) extending the ROP model as described herein; (b) finding the optimal trajectory; and checking whether the optimal trajectory is feasible (e.g., the maximum DLS does not exceed the actual limit for each inclination).

Figures 1, 20:
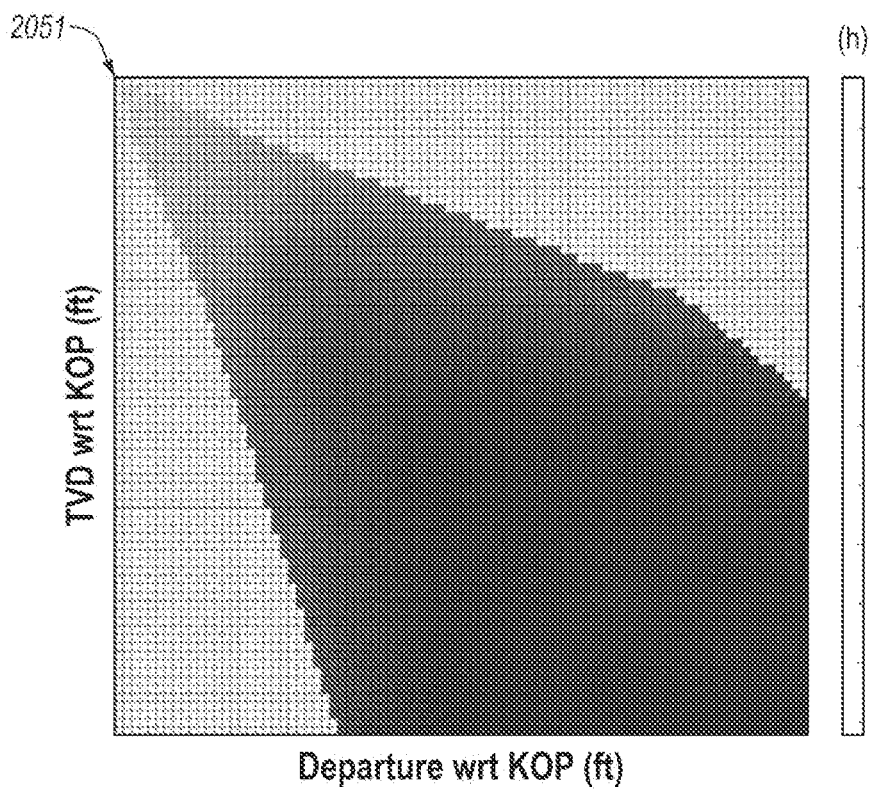
Figures 2, 20:
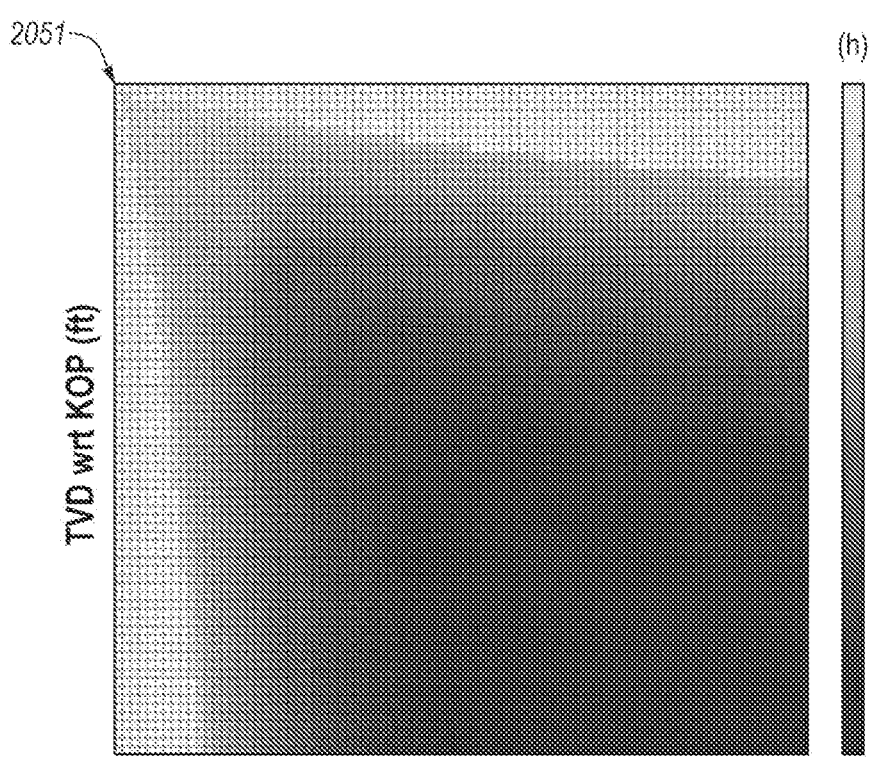

Computation of the Time-to-Target Values for Potential Target Positions with the Extended ROP Model FIG. 20-1 and FIG. 20-2 are representations of a T2T to a target that may be reached within a single 90° continuous build from a single KOP 2051. Using the plots in FIG. 20-1 and FIG. 20-2, and knowing where the KOP 2051 is located, the operator may determine the time it may take to drill to a particular target location. In FIG. 20-1, the T2T is calculated based on the determined using the hybrid model from FIG. 7. In FIG. 20-2, the T2T is calculated based on the determined T2T using the ROP hybrid model from FIG. 8. As may be seen, including the additional drilling information from FIG. 8 may help to identify trajectory solutions for target positions that appeared to be unreachable with a single 90-degree build trajectory.

Construction of T2T Maps for Optimal Well Placement and KOP Selection

Figures 3, 21:
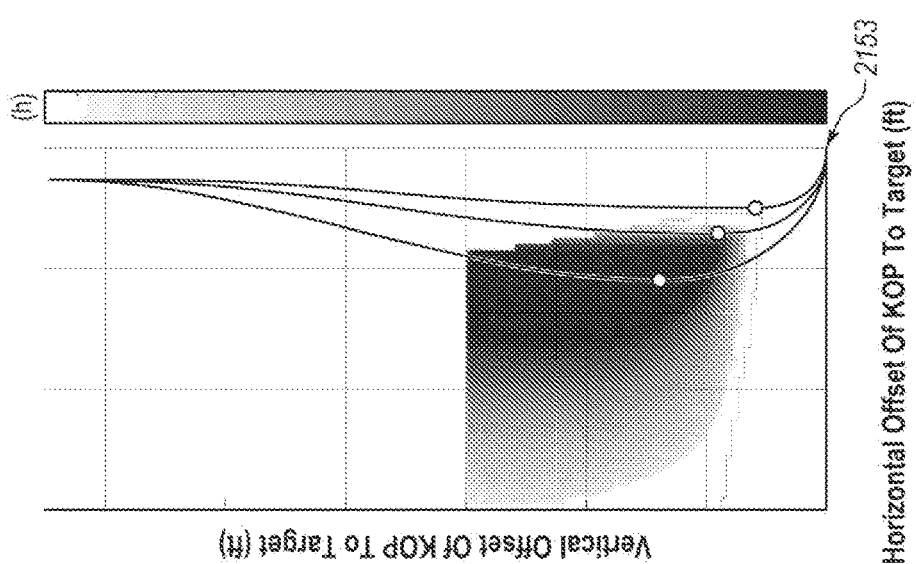
Figures 2, 21:
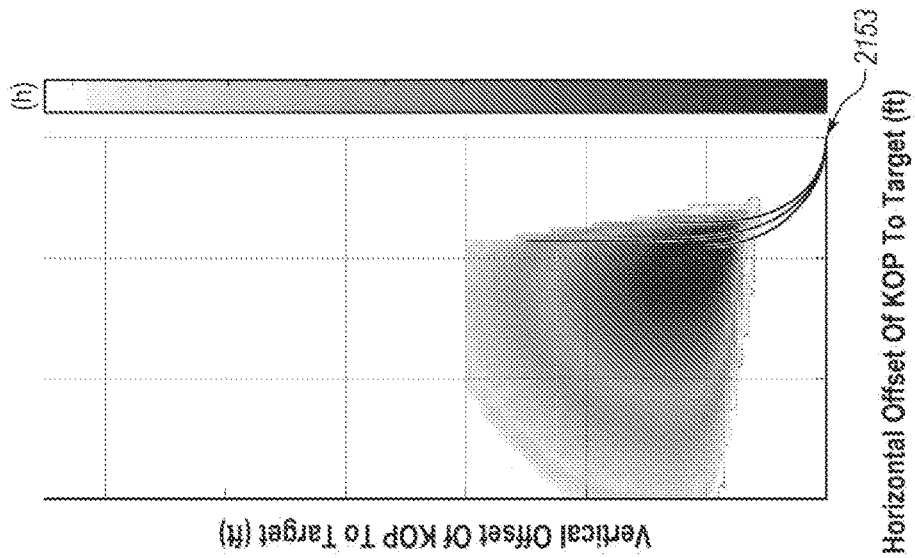
Figures 1, 21:
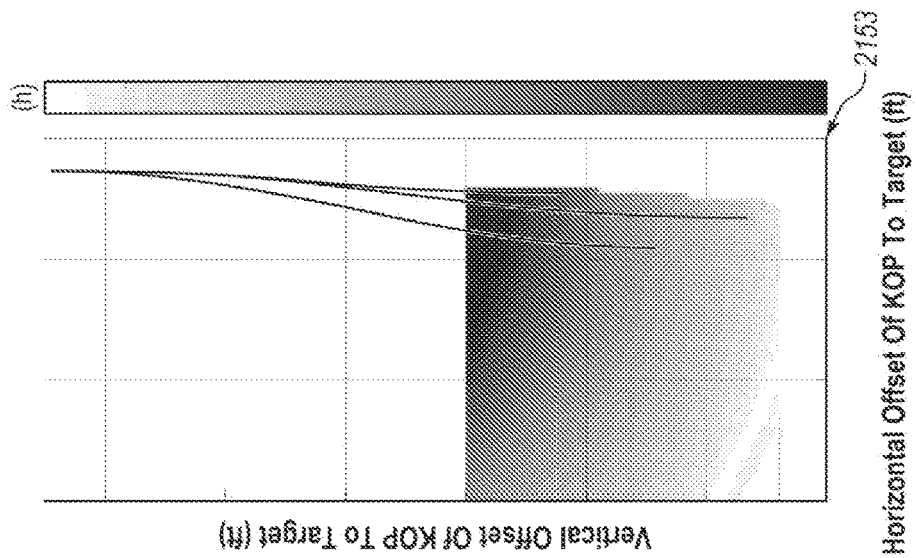

FIG. 21-1 is a representation of an s-curve T2T plot (e.g., a time-to-target plot) of a wellbore to a KOP relative to a target 2153 with vertical distance to the target on the vertical axis (e.g., the y-axis) and lateral distance to the KOP on the horizontal axis (e.g., the x-axis). The T2T plot of FIG. 21-1 may represent the vertical or s-curve section of a planned wellbore. Using the plurality of trajectories and their associated T2T, a map of the time it may take to drill to the KOP may be generated, with a T2T being developed for every distance from the KOP.

FIG. 21-2 is a representation of a T2T plot to drill a wellbore to a target from possible KOP points relative to the target 2153. Using the plurality of trajectories and their associated T2T, a map of the time it may take to drill from a KOP to the target 2153 may be generated for each vertical and lateral distance to the target 2153. Using the times indicated at a given distance from the target 2153, the drilling operator may develop an optimized target trajectory by selecting a KOP that will produce the target trajectory that has the lowest T2T (for a given set of parameters). In some embodiments, the selected KOP may minimize the T2T from the KOP to the target 2153. In the embodiment shown in FIG. 21-1, the drilling time to target is displayed based on the 90° build section of the wellbore.

In FIG. 21-3, the T2T based on the KOP may include both the vertical or s-curve section of a target wellbore from FIG. 21-1, the KOP, and the 90° build section from FIG. 21-2. The heat map of possible KOPs shown may allow a drilling operator to select a wellbore trajectory based on the KOP which takes into account the entire wellbore trajectory. In this manner, the drilling operator may optimize his or her wellbore trajectory based the T2T of the entire wellbore. This may result in an optimized P2P of 34.42 hours.

FIG. 21-1 and FIG. 21-3 are shown as having a single surface location from which the various trajectories are shown as originating. However, in some embodiments, the surface location of the wellbore may be varied. In some embodiments, the T2T from FIG. 21-1 and/or the T2T of FIG. 21-3 may include changes based on a change to the surface location of the wellbore. For example, moving the lateral position of the wellbore may change the trajectory of the vertical s-curve portion, change the position of the KOP, change the DLS, change any other factor, and combinations thereof. This may change the T2T. For example, moving the surface location further from the target 2153 may result in a decrease in DLS of the 90° build, which may decrease the T2T. In some examples, moving the surface location further from the target may increase the distance to the KOP, which may increase the T2T. In some embodiments, once a KOP has been selected, a T2T plot may be generated that illustrates the T2T for various surface location.

In accordance with embodiments of the present disclosure, subsurface data and drilling data may be processed to determine one or more T2T maps. For instance, a method for targeting drilling locations can include processing geological data and operational drilling data to evaluate risks during a drilling process. In some embodiments, the geological data may be received, collected, observed, or otherwise obtained from a geographical area. In some embodiments, the geographical area may include the target wellbore. In further embodiments, geological data or risks can be used to evaluate drilling plans and optimize new drilling plans and well trajectories.

One manner of characterizing the subsurface and obtaining geological data is to use seismic surveying. This can be done by imparting energy to the earth at one or more source locations, for example, by way of controlled explosion, mechanical input, and the like. Return energy may then be measured at surface receiver locations at varying distances and azimuths from the source location. The travel time of energy from source to receiver, via reflections and refractions from interfaces of subsurface strata, may indicate the depth and orientation of the strata.

Information about the subsurface may also be obtained in other manners. For instance, during or after drilling of a well, logging or testing equipment may be used to characterize the subsurface. By way of example, a wireline or logging-while-drilling tool may use acoustic, sonic, nuclear, or electrical measurement tools to evaluate formation resistivity and conductivity, porosity, formation pressure, and the like. Other tools may also perform fluid sampling, sidewall coring, and the like to evaluate downhole formation or fluids. Information from a well may be used to characterize the subsurface for a single well; however, information from multiple wells (considered offset wells) can be aggregated to provide an understanding of the subsurface to be intersected by additional wellbores that are to be drilled. Such information may indicate, for instance, formation tops, the presence of faults and fractures, formation porosity, the location of water or hydrocarbons, and the like.

Further information that may be obtained during drilling can relate to the operational aspects of drilling. For instance, the rate of penetration (ROP), properties of drilling mud, quantities of drilling mud, hole size, drilling system designs and components (e.g., managed pressure drilling systems, casing/liner drilling systems, motor drilling, coiled tubing drilling, rotary steerable bottomhole assemblies, types of drill bits, etc.), downhole measurements (vibration, shock, deviation from planned trajectories, etc.) can be collected. Other operational information may include drilling challenges and other outcomes. For instance, difficulty maintaining a planned trajectory, full or partial loss of mud circulation, drill bit damage, high vibration, etc. can be logged.

According to some aspects of the present disclosure, the tool and operational information can be correlated with geological data and associated with different drilling challenges. Put another way, by correlating the hazard events with geological features in the geological data, a hazard predictive model may be built. Thus, if a series of wells are seen to have a particular challenge (e.g., lost circulation), the subsurface information and the operational information can be reviewed (e.g., by using machine learning, neural network, etc.), to determine what likely led to the risk. In some embodiment, a risk matrix, cube, or other structure can be created for the subsurface and drilling parameters. This may indicate the various subsurface or operational features and identify the likelihood each has to contributing to the downhole challenge.

The characterization of faults, fractures, and other subsurface features in reservoir formations can be used with intersecting drilled wells to evaluate various risks and hazards. For instance, in addition to fluid/circulation loss, fractures may allow water to flow into wells and so decrease production. However, fractures and faults may also assist the flow of hydrocarbons from the reservoir can be assisted to increase production.

Information on fractures/faults or other subsurface features may therefore be balanced to avoid hazards while optimizing production. In some cases, geologic data can be used to determine modes of fracture, and in particular whether fracture clusters or networks or faults would be detectable in surface seismic data. It can also provide information on fracture network or fault inclination (i.e. average inclination of the fractures in a network relative to the horizontal) and strike azimuth (i.e. average direction of intersection of the fractures in a network relative to the horizontal). Discontinuity extraction software may be utilized to extract 3D volumes of fracture or fault networks from surface seismic or other geological data. Extracted fracture networks or faults may be parameterised in terms of the strength of their seismic response, and on their length, height and width.

Non-limiting examples of information obtained from seismic surveys, legacy, offset, or survey wells, or the like, can therefore include information related to horizons and formation tops, fault frameworks, seismic attributes, fracture networks, geomechanics models, and aerial gravitometer data. Some illustrative examples of seismic attributes include ant-tracking, 3D curvature, chaos, edge enhancement, amplitude contrast, and seismic fault ML.

As discussed, this information can be correlated with a catalog of drilling hazards and hazard events (e.g., fluid or other loss events) for each section of a well or subsurface to identify key geology and geophysics features and build a predictive losses/hazard cube/model to apply to the planned wells.

According to some embodiments of the present disclosure, a hazard predictive model may be developed and correlated to hazard events in offset wellbores (e.g., drilling fluid losses) with geological features (e.g., formation, discrete fracture networks, faults, etc. inferred from wellbore and geophysical data) and with drilling operational data (e.g., drilling mud pressure, drilling mud properties (e.g., fluid properties), pressure, tool/system design, bit diameter, bit type, steering system type, motor speed, etc.). In some embodiments, the hazard predictive model may model and provide predictions for any type of hazard. For example, the hazard predictive model may be a fluid loss predictive model. A fluid loss predictive model may predict geological features or hazards that may be associated with fluid loss events.

In accordance with embodiments of the present disclosure, a hazard predictive model may allow for the development of a well plan. In some embodiments, developing a well plan may include identifying and developing any aspect of a wellbore. For example, developing a well plan may include determining characteristics of a drilling mud to be used. The drilling mud may be associated as beneficial and/or a mitigating factor for one more hazards. In some embodiments, developing a mud plan may include developing or selecting a particular downhole tool, drilling tool, drilling system, BHA, any other downhole drilling tool or parameter, and combinations thereof. In some embodiments, developing a well plan may include developing any other operational data that will reduce the risk of drilling hazards and risks, including identifying downhole drilling parameters. For instance, if mud pressure above a particular threshold is seen as adding a 30% increase to the risk, the mud pressure can be maintained below the threshold to reduce the risk. Similarly, if casing-while-drilling systems have a 25% reduce risk of lost circulation, then casing-while-drilling BHAs may be used in lieu of traditional BHAs.

In some embodiments, the hazard identification may occur while drilling activities are on-going. For example, downhole drilling data may be used to identify new drilling hazards and/or clarify the details of previously identified drilling hazards. In some embodiments, when a hazard is identified and/or updated, developing the well plan may include changing a trajectory of the wellbore. As discussed herein, in some embodiments, changing the target trajectory may include preparing a plurality of new trajectories that start from the wellbore depth. The T2T of multiple newly developed trajectories may be evaluated, and the trajectory having the lowest T2T may be selected. As discussed herein, in some embodiments, changing the trajectory may include separating the target trajectories into upper sections (e.g., s-curve sections), lower sections (e.g., 90° build sections), which may be joined by a KOP.

Figure 22:
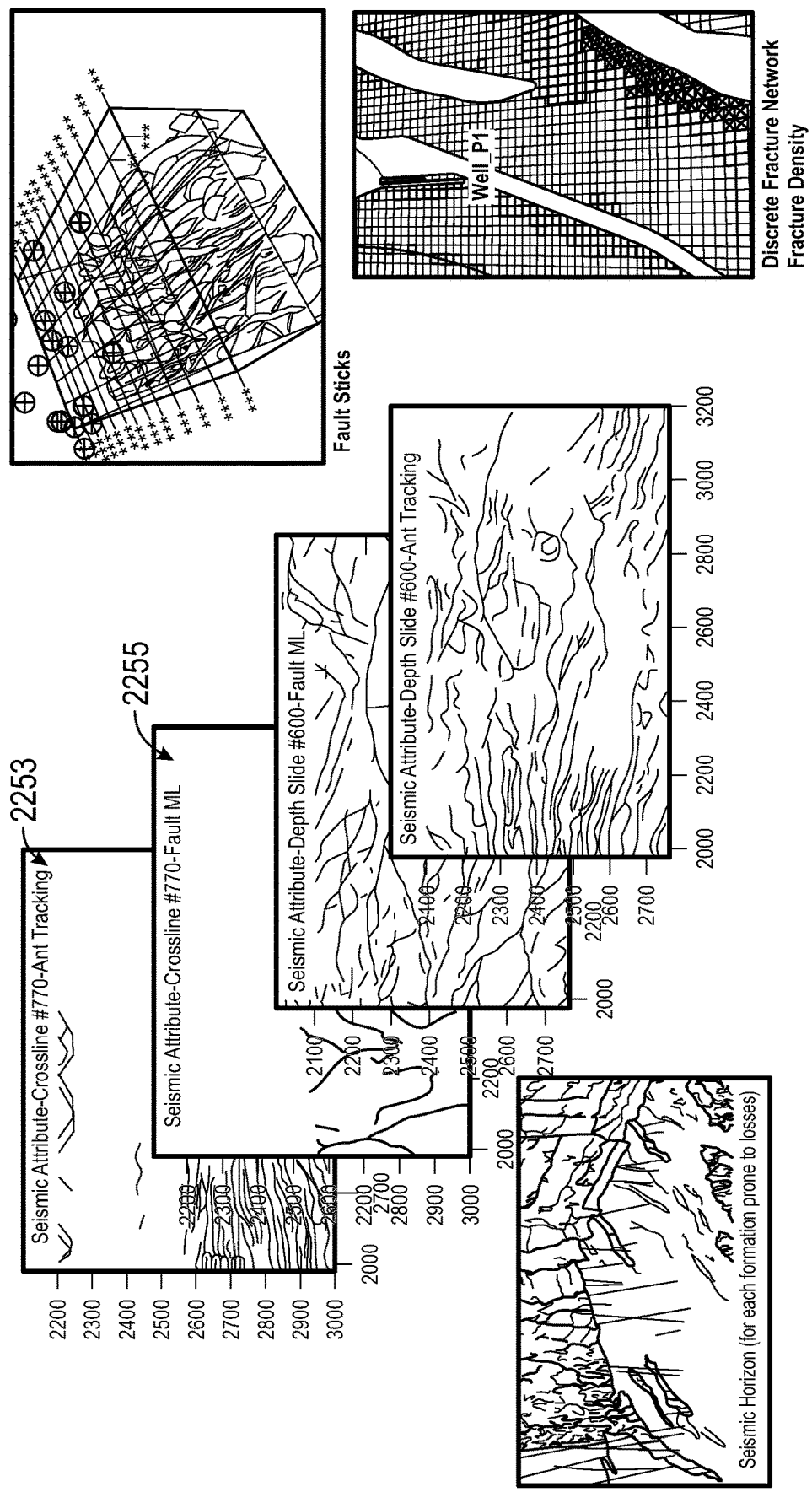
FIG. 22 is a diagram illustrating various types of information that may be used as an input to a system for predicting hazards in a subsurface, according to an embodiment of the present disclosure.
Figure 23:
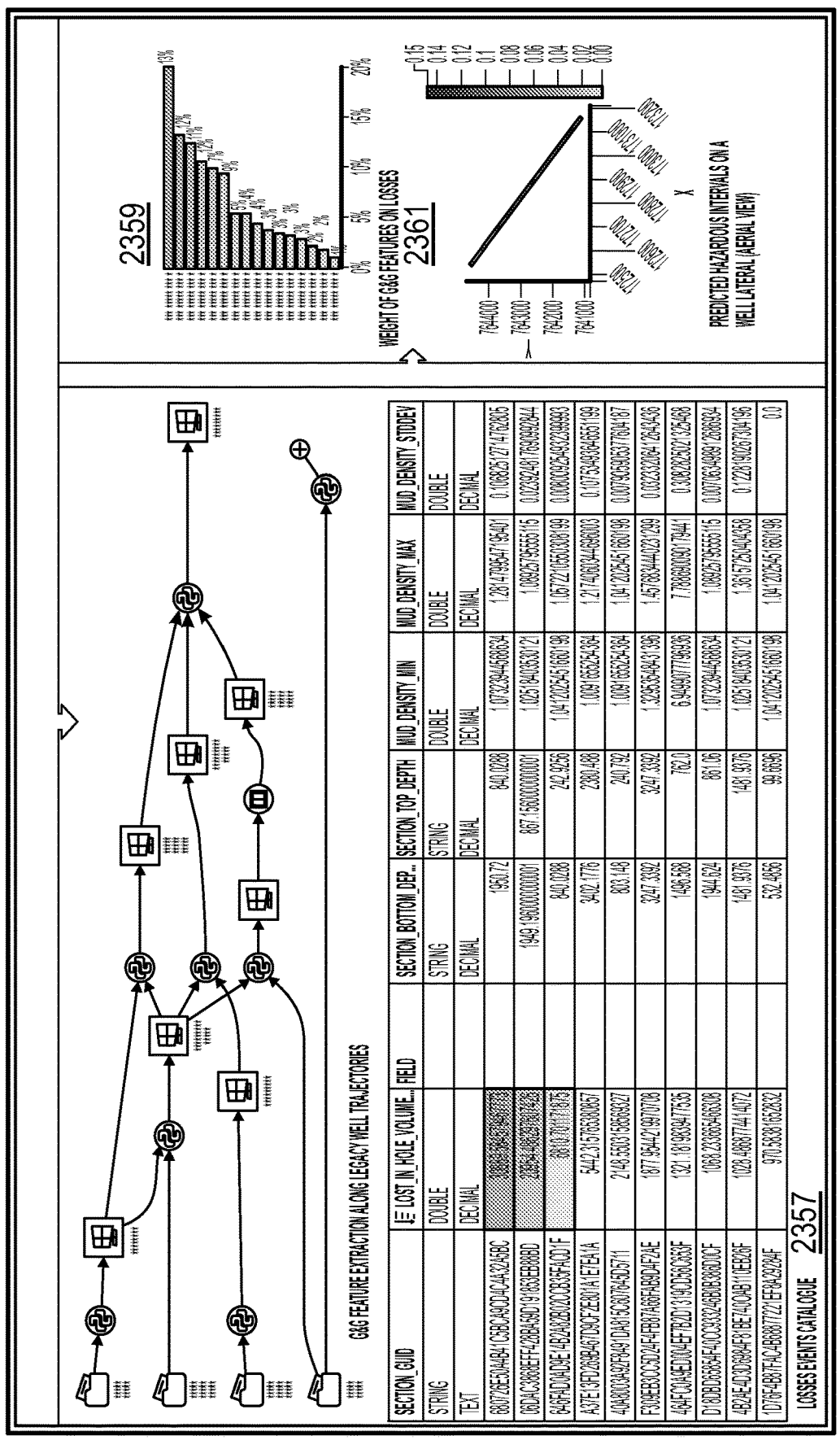
FIG. 23 is a schematic illustration of a system that may use information of FIG. 22 and a catalog of hazard events to weight a contribution of geologic and geophysical features to the hazards and to predict hazardous intervals while drilling a wellbore, according to an embodiment of the present disclosure.

An example process for evaluating drilling hazards and risks is shown in FIG. 22 and FIG. 23. In particular, FIG. 22 illustrates various examples of seismic data, and specifically includes crossline and depth slide information for ant tracking 2253 and fault machine learning (ML) data 2255. Additional information that may be considered includes the seismic horizon for each formation prone to a particular hazard (here fluid losses), fault sticks, and discrete fracture network fracture density information.

The information in FIG. 22 (in addition to or replaced by other types of information including that discussed herein, e.g., seismic chaos attributes, fault/fracture network planes, etc.) may be used in a geology and geophysics extraction method as shown in FIG. 23, and used to review the information along legacy well trajectories. A catalog 2357 of hazards (e.g., loss events) can be maintained and include, among other things, the type of loss (e.g., amount of fluid lost), the bottom and top depth of the section where the loss occurred, the mud density, drilling parameters at the time/depth of loss, and the like. In some embodiments, a single catalog 2357 may be maintained for multiple types of hazards. In some embodiments, or different catalogs 2357 may be used for different types of hazards. In combination with well trajectories, well trajectory risk features per horizon, well trajectory footage in formation, well trajectory distance to faults, well trajectory risk features per horizon, and the like, may help to provide a set of well depth attributes.

As further shown in FIG. 23, the in-depth catalogs 2357 may allow the various seismic attributes to be weighted to show the relative contribution to the hazard, as may be seen in the weight chart 2359. Such weighting may take into account all of the factors associated with multiple offset wellbores. In some embodiments, the weighting may be applied using a machine learning (ML) model. For example, a machine learning model may be trained to identify one or more patterns in the catalog 2357 of hazards. Such patterns may include geologic and geophysical features that may be is associated with a particular type of loss. For example, fault type, orientation, size, and so forth may be associated with lost circulation event. In some embodiments, a stronger correlation between hazard and loss event may result in a larger weight of a particular hazard with respect to a loss event. In some embodiments, a low correlation that is corresponded with a high loss event, such as a total lost circulation event, may result in a large hazard weight. The ML model may be continuously refined as additional data is added to it. In some embodiments, the ML model may predict hazardous intervals 2361 on a well lateral. This may help to identify potentially hazardous intervals of a particular lateral.

In addition to a hazard predictive model that can be used to identify and weight risk factors or select drilling operational designs and parameters, additional or other systems or aspects can include reducing likelihood of hazards (e.g., lost circulation) by optimizing the well trajectory, as discussed herein.

Figure 24:
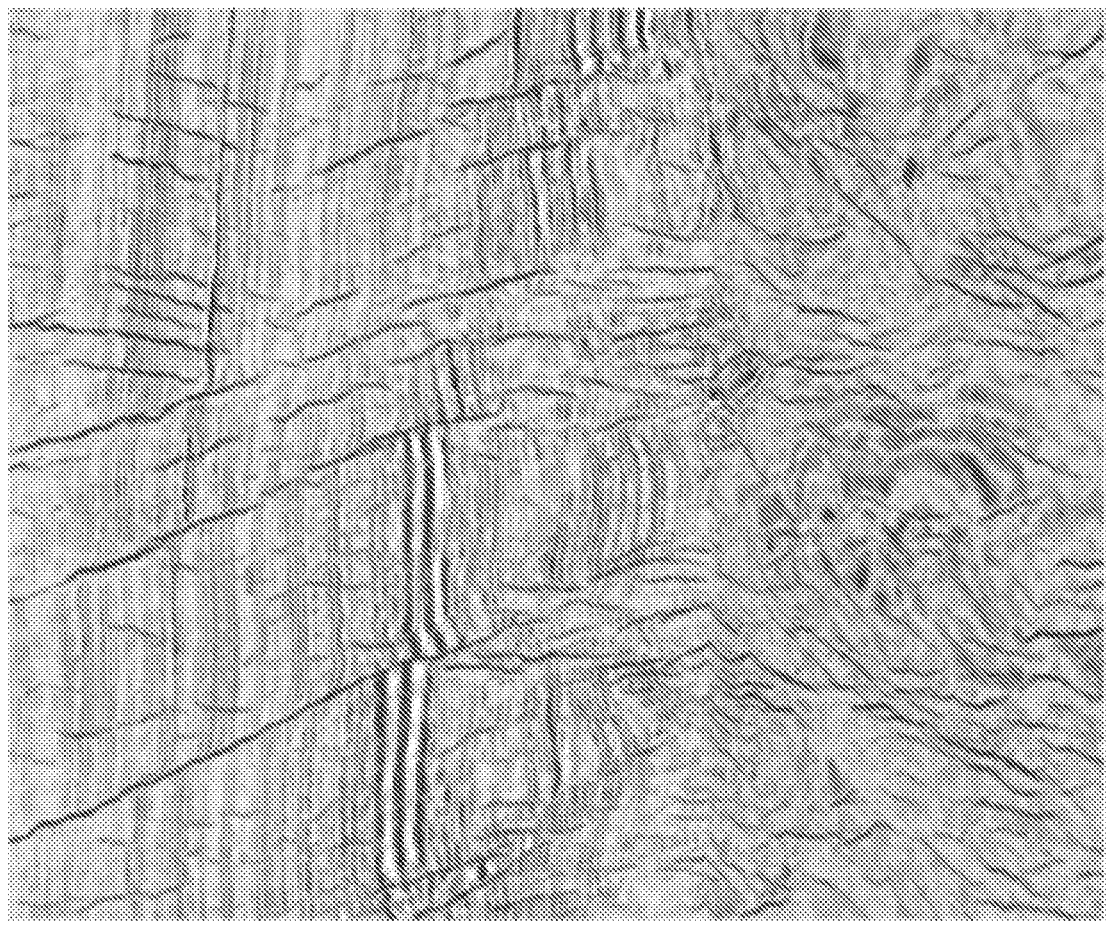
FIG. 24 is an ant tracking cube illustrating locations of suspected faults, according to an embodiment of the present disclosure.

FIG. 24, for instance, illustrates an example ant tracking cube revealing features that may be faults. The information from such an ant tracking cube may be used in connection with a well plan to evaluate the risk that such faults or other features could pose to a drilling operation. For instance, in addition to or in lieu of faults, fracture networks, loss zones, formation tops, etc. could be plotted from the ant tracking cube.

Figure 25:
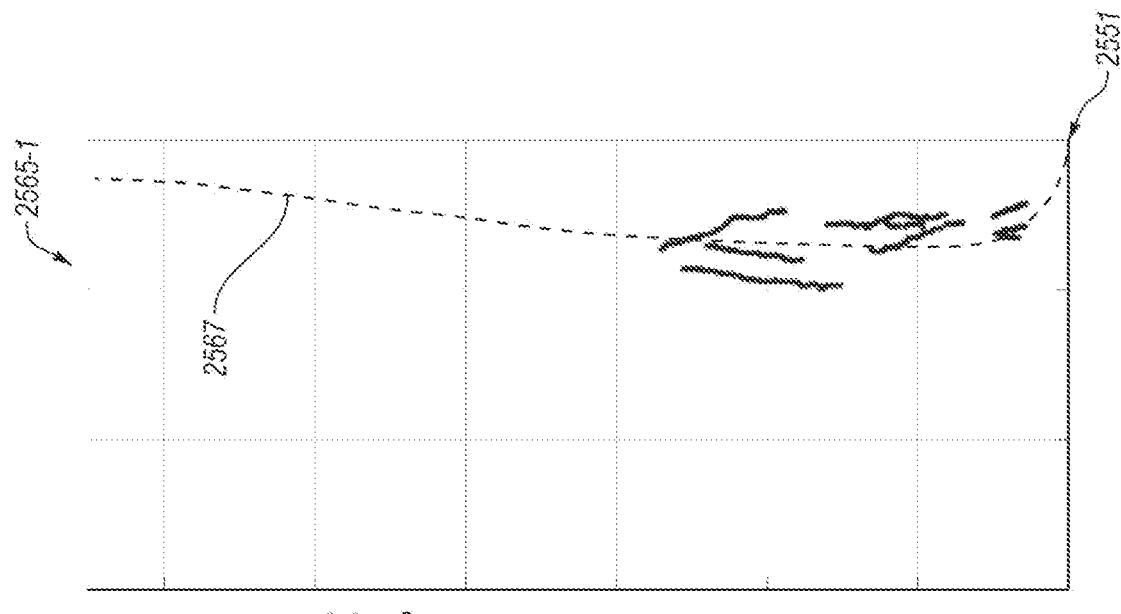
FIG. 25 is a set of charts illustrating hazard features in vertical and horizontal relation to a target location both without (left) and with (right) an expected well trajectory, according to an embodiment of the present disclosure.
Figure 25:
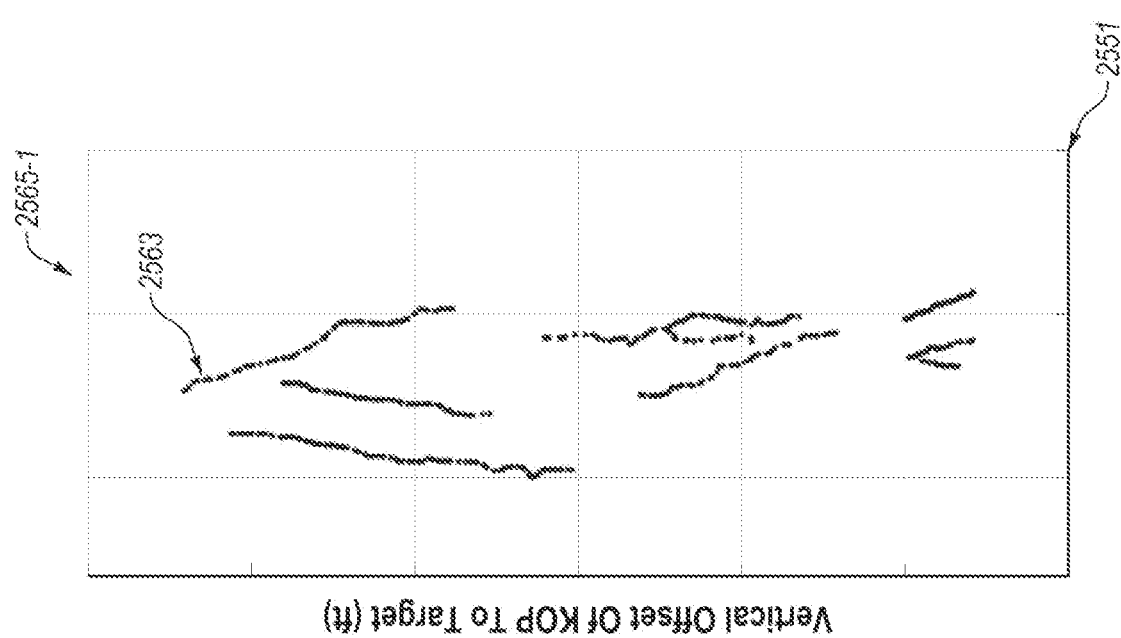

In FIG. 25, one or more geological features 2563 have been identified and plotted from using seismic, wireline, logging-while-drilling, inference, or other tools or techniques. The geological features 2563 have been plotted with respect to the target location 2551 (illustrated at the bottom right). In some embodiments, the geological features 2563 may be plotted from the ant tracking cube shown in FIG. 24. The vertical (e.g., y-axis) represents the vertical offset relative to the target location 2551, and the horizontal (e.g., x-axis) represents the horizontal offset relative to the target location 2551. In the first fracture chart 2565-1, shown on the left side of FIG. 25, the geological features 2563 are plotted. In the embodiments shown in FIG. 25, the geological features 2563 may be hazards in the formation, such as fractures. In the second fracture chart 2565-2, shown on the right side of FIG. 25, same geological features 2563 are plotted with a different vertical scale. In some embodiments, the geological features 2563 may be identified as hazards using the hazard identification system described herein. For example, the ant tracking cube of FIG. 24 may be provided to a ML model trained to identify and rank hazards. In some embodiments, the ML model may identify the geological features 2563 as hazards and plot the geological features 2563 on the fracture chart 2565.

In the second fracture chart 2565-2, a planned wellbore trajectory 2567 may be plotted with the geological features 2563. In this case, the planned wellbore trajectory has an upper s-profile section 2569, which may be section of the planned wellbore trajectory 2567 that is substantially vertical, or may include one or more low-inclination deviations from vertical. The s-profile section 2569 may reaches a KOP 2571. At the KOP 2571, the planned wellbore trajectory 2567 may transition to a lower 90° build section 2573. The 90 build section 2573 may extend to the target location 2551.

In the embodiment shown in FIG. 25, the geological features 2563 or hazards are identified and plotted in a 2D space. In some embodiments, the ML model may identify and plot hazards in a 3D space. The ML model may develop a cube or other space in which hazards may be identified and plotted. In some embodiments, each hazard may be assigned a severity weight. For example, a low severity hazard may be of little or no concern to drilling operations, and the drilling operator may drill through them with little to no change in drilling parameters or operations. A mid-level severity hazard may cause the drilling operator to change one or more drilling parameters to compensate for the hazard, such as changing WOB, RPM, fluid flow, mud composition/density, apply a lost circulation material (LCM), any other compensation mechanism, and combinations thereof. A high severity hazard may be avoided by a target trajectory.

As may be seen in the second fracture chart 2565-2, in some embodiments, a planned well trajectory may extend through the one or more geological features 2563 (e.g., the fracture network). The one or more geological features 2563 may pose certain risks during drilling (e.g., water inflow, fluid losses, etc.). In accordance with embodiments of the present disclosure, a target trajectory may be developed that avoids or minimizes contact with the one or more geological features 2563.

Figure 26:
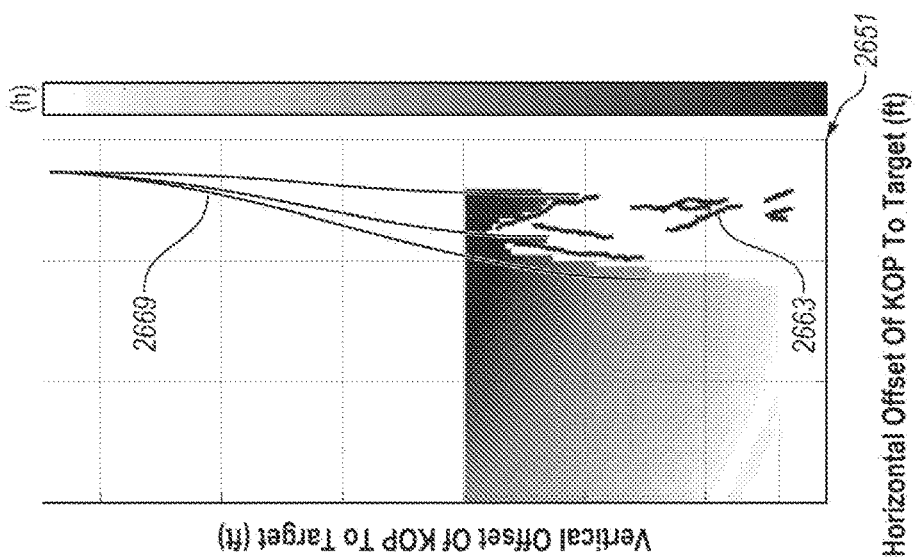
FIG. 26 is a map of time-to-target values for a trajectory section between an origin and a kickoff point, along with three example trajectories within the map that avoid geologic features, according to an embodiment of the present disclosure.

FIG. 26 is a representation of an s-curve T2T plot for an s-profile that indicates a section as un-drillable if it passes through one or more geological features 2663. A well trajectory planning system may identify various s-profile trajectories 2669 that may be used to reach a location of target 2651. In this embodiment, the trajectories plotted are associated with a drilling time, as indicated by the heat map illustrating the drilling time for reaching the target. The legend is shown to the right and generally shows that an upper section ending in the black section may have a drilling time of approximately 18 to 21 hours, while a trajectory ending in a white section may have a drilling time of 28 to 30 hours.

The T2T plot shown in FIG. 26 takes into consideration the geological features 2663, and identifies a plurality of s-curve trajectories 2669. For example, an automated planning process may include inputs that request a plan that limits fracture/hazard area contact to a certain percentage of the trajectory length, or to a particular type of hazard. In some examples, the planner may have an input requesting trajectories that maintain an offset separation from a hazard (e.g., at least 50 ft. (15 m), 100 ft. (30 m), or 200 ft. (60 m)).

The trajectories that are developed when considering the hazards may also have an overlay of both the hazards and the drilling time heat map. This chart, for instance, includes 3 trajectories that avoid the fracture network, with two ending in the black area and one in the gray area. The s-profile trajectory 2669 shown ends above at least a portion of the fracture network.

Figure 27:
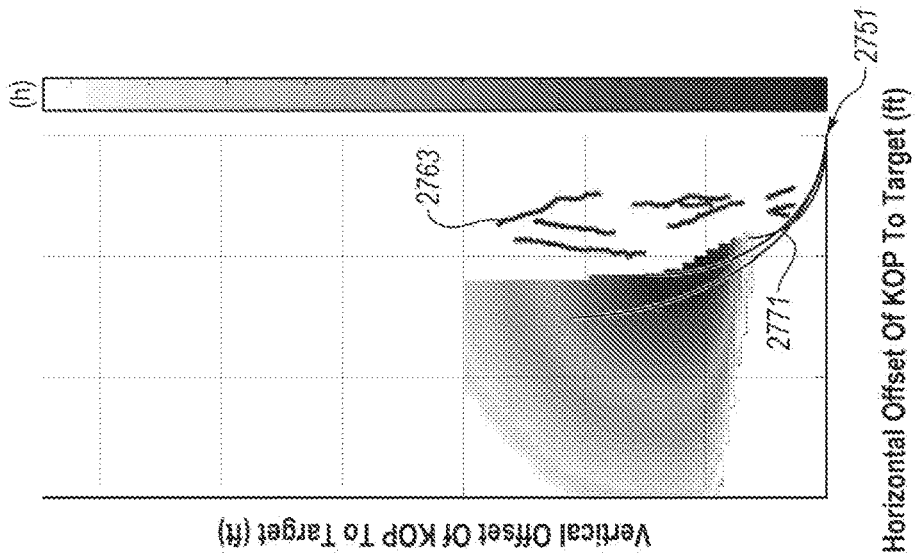
FIG. 27 is a map of time-to-target values for a trajectory section between a kickoff point and a final target, along with three example trajectories within the map that avoid geologic features, according to an embodiment of the present disclosure.

FIG. 27 is a representation of a T2T plot of a 90° build section 2771 that takes into consideration the geological features 2663. The 90° build section 2771 may start from a KOP, and the heat map overlay may identify the time it may take to drill to the target 2751. As may be seen in FIG. 27, the heat map does not include any T2T times for a KOP that would result in the 90° build section 2771 that intersects one or more of the geological features 2763.

Figure 28:
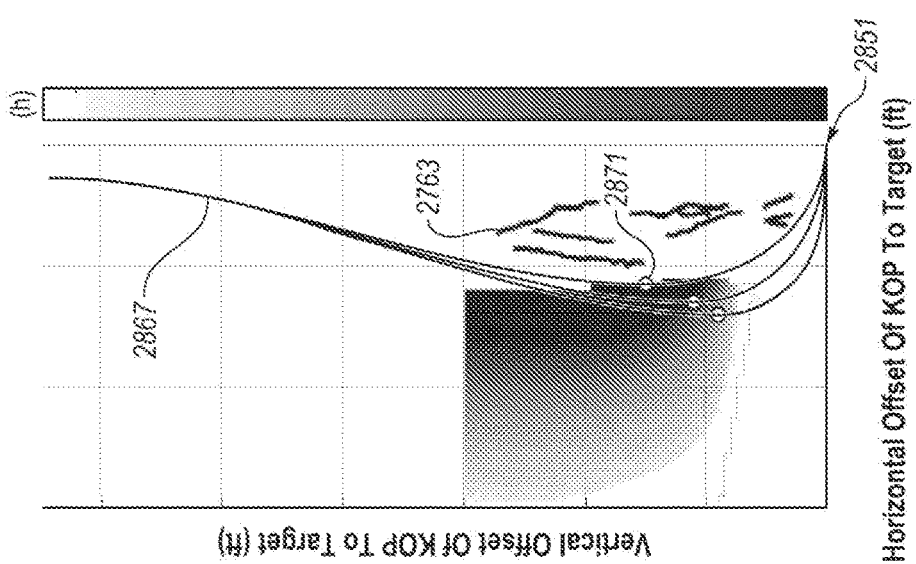
FIG. 28 is a map of total time-to-target values for a drilling trajectory composed of two sections that avoid obstacles, and includes three example trajectories within the map, according to an embodiment of the present disclosure.

FIG. 28 is a representation T2T plot for a composite wellbore target trajectory 2867. The T2T plot shown includes drilling of the upper section to the KOP (see, e.g., FIG. 26), and then from the KOP along the 90° build section to the target location 2851, (see, e.g., FIG. 27). The T2T plot shown in FIG. 28 may be indexed, or the heat map may be generated displaying times relative to, the KOP. Using this T2T plot, and the associated heat map, an optimized target trajectory 2867 may be developed that accounts for and avoids the geological features 2863.

In accordance with embodiments of the present disclosure, a user may select a target trajectory based on a selected KOP. The selected KOP may be associated with a total T2T. In some embodiments, to minimize the T2T, the user may select a KOP that is associated with a minimum total T2T. In this manner, the optimized target trajectory 2867 may be optimized based on the presence of one or more geological features 2863 and/or other hazards. In this manner, a robust target trajectory 2867 may be developed that may have the fastest T2T, while avoiding the one or more geological features 2863. This may result in an optimized P2P of 34.43 hours.

In some embodiments, by developing the target trajectory 2867 to include the entire wellbore (e.g., the s-curve trajectory, the KOP, and the 90° build trajectory), the optimum T2T shown in FIG. 28 may only be slightly different than that shown in FIG. 21-3. As may be seen, the heat maps in FIG. 21-3 and FIG. 28 have approximately the same scale.

By using a composite structure to evaluate drilling time to the kickoff point, and then drilling time from the kickoff point to the target location, and which also considers hazard locations, potential hazards can be mitigated. Moreover, as shown, this may not necessitate a significant difference in drilling time (34.42 hours vs 34.43 hours). Indeed, in some embodiments, the optimized trajectory may have a time savings. For example, the trajectory shown in FIG. 4 may have a T2T of 39.1 hours. Thus, the optimized target trajectory 3867 that avoids the one or more geological features 2863 may have a time savings (34.43 hours vs. 39.1 hours).

FIG. 26 and FIG. 28 are shown as having the same surface location for the various target trajectories. In some embodiments, a T2T plot may include a heat map that illustrates a change in surface location. Changing the surface location may have an impact on how the geological features 2663 may be avoided. For example, moving the surface location further away from the target 2651 may reduce the curvature of the s-profile trajectories, which may change the T2T. In this manner, a drilling operator may optimize his or her wellbore trajectory based on one or both of the KOP and the surface location of the wellbore.

Figure 29:
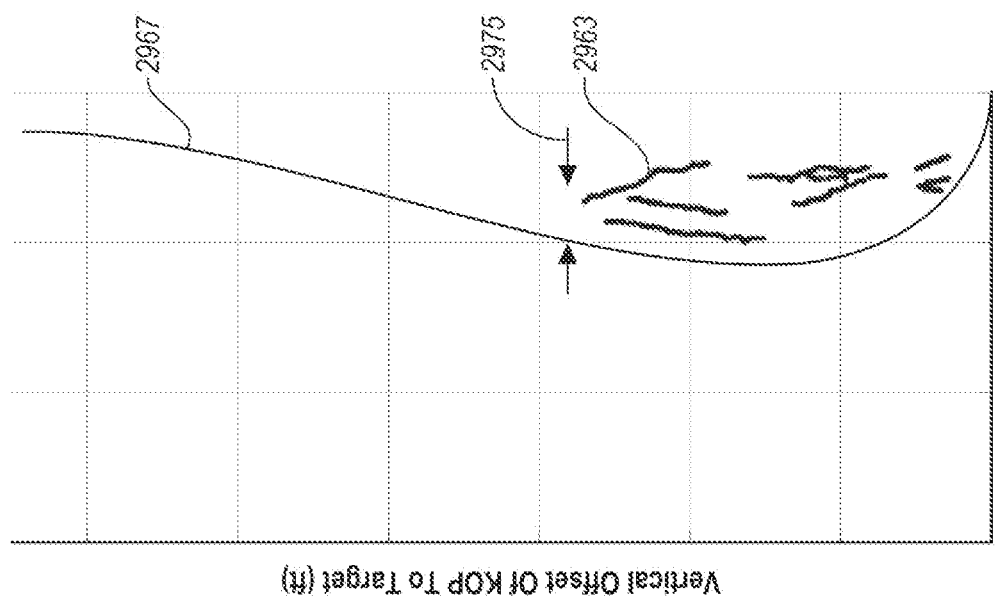
FIG. 29 is a map of an optimal trajectory when considering an offset distance constraint relative to discrete obstacles, according to some embodiments of the present disclosure.

FIG. 29 is a representation of a wellbore plot in which a target trajectory 2967 is plotted as offset with an offset distance 2975 from one or more geological features 2963. In some situations, the geological features 2963 may be models of projected geological features based on data received from offset wells. As such, the geological features 2963 may have an actual extent in the formation that does not perfectly match the mapped extent. In accordance with embodiments of the present disclosure, offsetting the target trajectory 2967 with the offset distance 2975 may allow the drilling operator to account for any uncertainty in the actual location of the geological features 2963. This may help the operator to avoid the hazard, thereby reducing the chance of a loss. In some embodiments, the offset distance 2975 may be in a range having an upper value, a lower value, or upper and lower values including any of 25 ft. (7.6 m), 50 ft. (15 m), 75 ft. (23 m), 100 ft. (30 m), 125 ft. (38.1 m), 150 ft. (46 m), 175 ft. (53 m), 200 ft. (61 m), or any value therebetween. For example, the offset distance 2975 may be greater than 25 ft. (7.6 m). In another example, the offset distance 2975 may be less than 200 ft. (61 m). In yet other examples, the offset distance 2975 may be any value in a range between 25 ft. (7.6 m) and 200 ft. (61 m). In some embodiments, it may be critical that the offset distance 2975 is less than 50 ft. (15 m) to avoid hazards while maintaining an optimized T2T.

Trajectories Near Obstacles: Some Examples of Constraints and Cost Functions

Figure 30:
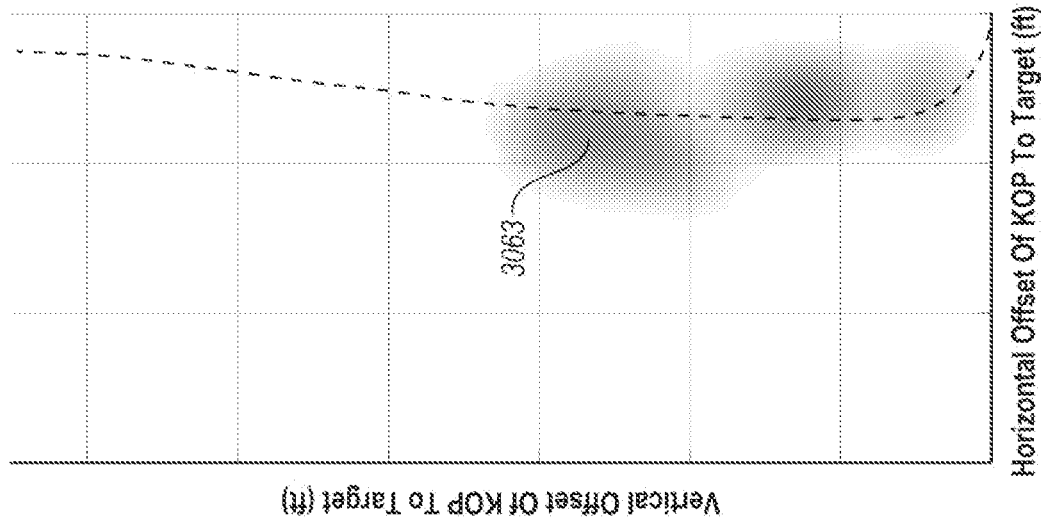
FIG. 30 is a map of an optimal trajectory when a risk map is considered in view of a cost function, according to some embodiments of the present disclosure.

If obstacles are discrete features in space, a minimum distance constraint can be used in designing the optimal trajectories, as may be seen in FIG. 30. In certain embodiments, obstacles may be expressed as some risk map in 2D or 3D space. For instance, a smoothed or average fracture density may be represented in 3D space, or a more sophisticated function which captures risk in drilling through that part of the volume may be captured. FIG. 30 illustrates an example visualization in which the risk of a geological feature 3063 is illustrated as a hazard zone (expressed herein as a heat map) rather than as a discrete object. The highest risk of the geological feature 3063 may be represented by the darkest portion of the heat map, with the risk lessening with lighter shades of grey. This may allow a drilling operator to determine how much risk he or she is willing to assume for a particular wellbore trajectory. In some cases, a cost function may be used to optimize the trajectory in the presence of such obstacles. The cost function may include, for instance, calculations similar to those in Equations 5 to 7.

$$\text{Cost} = \int_{\text{Trajectory}} \left(\frac{\text{Risk}}{\text{map}}\right) dl \qquad \text{EQ. 5}$$

$$\text{Cost} = \int_{\text{Trajectory}} \left(\frac{\text{Risk}}{\text{map}}\right)^2 dl \qquad \text{EQ. 6}$$

$$\text{Cost} = \max_{\text{Trajectory}}(\text{Risk map}) \qquad \text{EQ. 7}$$

INDUSTRIAL APPLICABILITY

Past experiences with some drilling tools have shown that physical modelling using PBM can sometimes overestimate the DLS capability of the tool, leading to significant divergence with the planned trajectory during drilling. One method to correct for this is to use acquired data and machine learning (e.g., Gaussian process regression) to predict a correction term to what was suggested by PBM. This idea can be useful in practice to evaluate existing trajectory designs, while some embodiments of the present disclosure relate to a more challenging task of designing new trajectories based on templates or from scratch.

In the past, trajectories for drilling have primarily been designed based on geometrical principles. Such an approach can ignore predicted tool performance (e.g., a ROP model as a function of DLS and INC). As a result, the trajectory design may prescribe some DLS values (at certain inclinations) that the drilling tool cannot provide, leading to the well missing the target. Additionally, the drilling of the well to the target can take longer than what could be achieved otherwise.

To instead create a new trajectory based on tool capabilities, a detailed tool performance model can be used. This model may include features such as a predicted maximum feasible DLS per INC value, a predicted ROP as a function of all feasible DLS and INC values, and predicted values of steering parameters as a function of DLS of INC, in order to achieve the predicted ROP.

To use the tool capabilities, the ROP as a function of DLS can be based on physical modelling, such as a physics-based modeling (PBM) tool such as the IDEAS modeling tool available from Schlumberger. The prediction obtained by PBM can be further improved by using prior performance data from offset wells, the current well itself, or other sources. Such an improvement may be achieved by machine learning (ML), for example by Gaussian process regression. Predicting drilling tool behavior by physical and ML modelling allows construction of a complete ROP model as a function of DLS and INC, and the procedure can provide us with optimal values for steering parameters for multiple combinations of DLS and INC, and potentially all combinations of DLS and INC within a feasible range.

Using the predicted ROP (and DLS vs. INC) model, we can design trajectories that optimally exploit predicted tool performance. Parametric curve templates are convenient tools to use in the design of optimal trajectories, and can include, for instance, generalized superellipses and Bézier curves. Additionally, since the optimization can be done quickly, time-to-target (T2T) maps can be constructed for all possible KOPs within a subterranean location, and these can be used for well placement and KOP selection. Optimal trajectories can also be designed, and T2T maps can be created, that consider the presence of obstacles, including fracture zones that may cause loss of drilling fluids.

Computing systems may be used in order to perform aspects of the embodiments disclosed herein. For instance, a computing system may be used in pre-drilling design of an optimized trajectory, and various special-purpose computing systems (e.g., rig or downhole-based drilling tool systems) may be used to drill the well according to the optimized trajectory. In the same or other embodiments, such rig and/or downhole-based drilling tool systems can include computing components to perform real-time processing during drilling to re-calculate drilling trajectories based on myriad factors, including observed deviations from a drilling plan, the location of known or previously unknown hazards, tool (e.g., drill bit) condition, and the like. A suitable computing system may include one or more processors of varying core configurations (including multiple cores) and clock frequencies. Such processors may be operable to execute instructions, apply logic, etc. It will be appreciated that these functions may be provided by multiple processors or multiple cores on a single chip operating in parallel, in sequence, or communicably linked together. In at least one embodiment, one or more of the processors may include one or more GPU.

A computing system may also include memory, which may be or include one or more memory devices or computer-readable media of varying physical dimensions, accessibility, storage capacities, and the like. Such media can include flash drives, hard drives, disks, random access memory, etc., for storing data, such as images, files, and program instructions for execution by one or more processors. In an embodiment, such computer-readable media may be computer-readable storage media that stores instructions that, when executed by a processor, are configured to cause the processor (and the computing system) to perform operations. For example, execution of such instructions may cause the computing system to implement one or more portions or embodiments of the methods described herein.

A computing system may also include one or more network interfaces for communicating over wired or wireless media using protocols, such as Ethernet, wireless Ethernet, etc. The network interface(s) may include any hardware, applications, or other software, and may therefore include Ethernet adapters, wireless transceivers, PCI interfaces, serial network components, other components, or combinations thereof, for communicating over wired or wireless media. The wireless media may also be considered a type of computer-readable media, and more particularly computer-readable transmission media, which is distinct from the computer-readable storage media described above, although computer-readable storage media and computer-readable transmission media may be communicatively linked.

The processor system may take a number of suitable forms, and may be a mobile device that includes one or more network interfaces for communication of information, a server, a client in communication with a server, the combination of one or more servers and one or more clients, a standalone computing system (e.g., a desktop or laptop), or the like. An example computing device may include a wireless network interface (e.g., operable via one or more IEEE 802.11 protocols, ETSI GSM, BLUETOOTH®, satellite, etc.). As an example, a computing device includes components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, a battery, and the like. In the case of a mobile device or a client, the computing device may be configured as a cell phone, a tablet, etc. As an example, methods of the present disclosure may be implemented (e.g., wholly or in part) using a mobile device. As an example, a computing system may include one or more mobile devices.

The computing system may also include one or more peripheral interfaces, for communication with a display, projector, keyboards, mice, touchpads, sensors, other types of input or output peripherals, and the like. As an example, information may be input from a display (e.g., a touchscreen), output to a display, or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.). Accordingly, a well trajectory could be constructed within a representation of a subterranean formation.

In some implementations, the components of computing system are not enclosed within a single enclosure or even located in close proximity to one another, but in other implementations, the components or other features may be provided in a single enclosure. As an example, a system may be a distributed environment, for example, a so-called "cloud" environment where various devices, components, etc. interact for purposes of data storage, communications, computing, etc. As an example, a method may be implemented in a distributed environment (e.g., wholly or in part as a cloud-based service).

Memory may be physically or logically arranged or configured to store data on one or more storage devices, which can include one or more file systems or databases in any suitable format. A storage device may also include one or more software programs containing interpretable or executable instructions for performing processes such as disclosed herein, or portions thereof. When requested by one or more processors, software programs or a portion thereof may be loaded from the storage devices into memory for execution by the processor(s) and cause the processor(s) to perform one or more actions.

Those skilled in the art will appreciate that the above-described componentry is merely one example of a hardware configuration, as a computing or processor system may include any type of hardware components, including any accompanying firmware or software, for performing the disclosed implementations. Such a system may also be implemented in part or in whole by electronic circuit components or processors, such as application-specific integrated circuits (ASICs) or field-programmable gate arrays (FPGAs).

Following are sections in accordance with embodiments of the present disclosure:

A1. A method for designing a wellbore, comprising:
  using downhole tool parameters, predicting one or more capabilities of a downhole drilling tool;
  using a target and the predicted one or more capabilities, determining a target trajectory to the target;
  analyzing the target trajectory based on one or more drilling parameters; and
  determining a time to target of the target trajectory.

A2. The method of section A1, wherein predicting the one or more capabilities of the downhole drilling tool includes:
  using a physics-based model to predict a dogleg severity; and
  correcting the physics-based model using a machine learning model.

A3. The method of section A1 or A2, wherein the downhole tool parameters include a predicted maximum feasible dogleg severity per inclination.

A4. The method of any of sections A1-A3, wherein predicting the one or more capabilities includes a predicted rate of penetration for one or more combinations of dogleg severity and inclination.

A5. The method of any of sections A1-A4, wherein the predicting the one or more capabilities includes predicting one or more predicted steering parameters for one or more combinations of dogleg severity and inclination.

A6. The method of any of sections A1-A5, wherein determining the target trajectory includes using one or more of generalized superellipse or Bézier curve templates.

A7. The method of any of sections A1-A6, wherein determining the target trajectory includes constructing a time-to-target plot for possible kickoff points in the target trajectory.

A8. The method of any of sections A1-A7, wherein predicting the one or more capabilities includes iteratively evaluating steering parameters until a predicted dogleg severity converges with a desired dogleg severity.

B1. A method for designing a wellbore, comprising:
predicting an achievable dogleg severity and steering parameters for a plurality of combinations of inclination and dogleg severity;
for each combination of the plurality of combinations, predicting a rate of penetration based on the achievable dogleg severity and the steering parameters; and
comparing a target trajectory with the predicted rate of penetration for the plurality of combinations.

B2. The method of section B1, wherein the plurality of combinations include minimum and maximum wellbore inclination between 0° and 90°.

B3. The method of section B1 or B2, wherein the plurality of combinations include minimum and maximum wellbore dogleg severity between 0°/100' and 24°/100'.

B4. The method of any of sections B1-B3, wherein comparing the target trajectory includes comparing a plurality of target trajectories, and further comprising determining a time to target of each target trajectory of the plurality of target trajectories.

B5. The method of section B4, further comprising selecting a selected target trajectory of the plurality of target trajectories that has a minimum time to target.

B6. The method of any of sections B1-B5, wherein comparing the target trajectory includes using at least one of a look-up table, a graph, or a chart.

B7. The method of any of sections B1-B6, wherein predicting the rate of penetration includes providing a pseudo rate of penetration for an un-drillable area that has a rate of penetration that declines as a function of dogleg severity.

C1. A method for designing a wellbore, comprising:
identifying a plurality of kickoff points between a surface location and a target;
for each kickoff point of the plurality of kickoff points, determining a s-curve time to target to the kickoff point;
for each kickoff point of the plurality of kickoff points, determining a 90 build time to target to the target;
for each kickoff point of the plurality of kickoff points, determining a total time to target to the target; and
selecting a target trajectory based on a selected kickoff point associated with a selected total time to target.

C2. The method of section C1, wherein selecting the target trajectory includes selecting the target trajectory based on the lowest total time to target.

C3. The method of section C1 or C2, wherein selecting the target trajectory includes selecting the target trajectory based on one or more of generalized superellipse or Bézier curve templates.

C4. The method of any of sections C1-C3, further comprising:
using the target trajectory, drilling the wellbore.

C5. The method of section C4, wherein determining the total time to the target and selecting the target trajectory continue during drilling of the wellbore.

D1. A method for planning a wellbore, comprising:
obtaining geological data corresponding to a geographic area including plurality of offset wellbores;
obtaining drilling operational data from drilling of the plurality of offset wellbores;
identifying hazard events that occurred during drilling of the plurality of offset wellbores;
correlating the hazard events with geological features in the geological data and with the drilling operational data;
building a hazard predictive model based on the correlating of the hazard events with the geological features and the drilling operational data; and
developing a well plan based on the hazard predictive model.

D2. The method of section D1, wherein developing the well plan includes determining characteristics of drilling mud for use in drilling the wellbore.

D3. The method of section D1 or D2, wherein developing the well plan includes selecting a drilling tool or system.

D4. The method of any of sections D1-D3, wherein developing the well plan includes changing a trajectory of the wellbore.

D5. The method of section D4, wherein changing the trajectory includes evaluating a time to target for multiple trajectories.

D6. The method of section D5, wherein changing the trajectory includes selecting a target trajectory having a lowest time to target.

D7. The method of any of sections D4-D6, wherein changing the trajectory includes separating the trajectory into at least an upper section and a lower section.

D8. The method of any of sections D1-D7, wherein the hazard predictive model is a fluid loss predictive model.

D9. The method of any of sections D1-D8, wherein the geological features include one or more of: formation; discrete fracture network; or faults.

D10. The method of any of sections D1-D9, wherein the drilling operational data includes one or more of: drilling mud properties; drilling mud pressure; drilling system design; weight-on-bit; motor speed; bit diameter; steering system type; or bit type.

E1. A method for planning a wellbore, comprising:
identifying one or more hazard zones using geological data from offset wellbores;
identifying a plurality of kickoff points between a surface location and a target;
for each kickoff point of the plurality of kickoff points, determining a s-curve time to target to the kickoff point, wherein each s-curve time to target includes an s-curve trajectory that avoids the one or more hazard zones;
for each kickoff point of the plurality of kickoff points, determining a 90 build time to target to the target, wherein each 90 build time to target includes a 90 build trajectory that avoids the one or more hazard zones;
for each kickoff point of the plurality of kickoff points, determining a total time to target to the target; and
selecting a target trajectory based on a selected kickoff point associated with a selected total time to target.

E2. The method of section E1, wherein at least one of the s-curve trajectory or the 90 build trajectory avoids the one or more hazard zones with an offset distance.

E3. The method of section E2, wherein the offset distance is greater than 50 ft.

E4. The method of any of sections E1-E3, wherein selecting the target trajectory includes selecting the selected kickoff point based on a minimum total time to target.

F1. A wellbore planning system, comprising:
  a downhole drilling tool;
  a processor and memory, the memory including instructions which, when accessed by the processor, cause the processor to:
    using geological data and drilling operation data for a plurality of offset wellbores, identify hazard events that occurred during drilling of the plurality of offset wellbores;
    correlate the hazard events with geological features in the geological data and with the drilling operational data;
    build a hazard predictive model based on the correlating of the hazard events with the geological features and the drilling operational data; and
    develop a well plan for the downhole drilling tool based on the hazard predictive model.

F2. The system of section F1, wherein developing the well plan includes changing a trajectory of the wellbore.

F3. The system of section F2, wherein changing the trajectory includes evaluating a time to target for multiple trajectories.

F4. The system of section F3, wherein changing the trajectory includes selecting a target trajectory having a lowest time to target.

F5. The system of any of sections F2-F4, wherein changing the trajectory includes separating the trajectory into at least an upper section and a lower section.

F6. The system of any of sections F1-F5, wherein the memory further includes instructions which cause the processor to drill the wellbore with the downhole drilling tool.

The embodiments of well planning systems have been described herein primarily with reference to maximizing ROP in view of trajectory (DLS) and inclination (INC), although other embodiments may be used to drill a wellbore and plan a trajectory based on other considerations. For instance, the specific target location, the tool life, the number of trips, the wellbore quality, the vibration profile, and other considerations may also or alternatively be used in planning a wellbore. In other embodiments, wellbore trajectory planning systems according to the present disclosure may be used outside a wellbore or other downhole environment used for the exploration or production of natural resources. For instance, wellbore trajectory design may be used for the placement of utility lines. Accordingly, the terms "wellbore," "borehole" and the like should not be interpreted to limit tools, systems, assemblies, or methods of the present disclosure to any particular industry, field, or environment.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

Various features are described herein in alternative format in order to emphasize that features may be combined in any number of combinations. Each feature should be considered to be combinable with each other feature unless such features are mutually exclusive. The term "or" as used herein is not exclusive unless the contrary is clearly expressed. For instance, having A or B encompasses A alone, B alone, or the combination of A and B. In contrast, having only A or B encompasses A alone or B alone, but not the combination of A or B. Even if not expressly recited in multiple independent form, the description provides support for each claim being combined with each other claim (or any combination of other claims).

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method for designing a wellbore, the method comprising:
    predicting, using a physical-based model (PBM) and downhole tool parameters, a dogleg severity (DLS) capability of a downhole drilling tool for a given inclination;
    predicting, using the PBM and the downhole tool parameters, a rate of penetration (ROP) capability of the downhole drilling tool for the DLS and inclination combination;
    correcting, using a machine learning (ML) model, the predicted DLS capability of the downhole drilling tool and the predicted ROP capability of the downhole drilling tool;
    determining, using a target, the corrected DLS capability of the downhole drilling tool, and the corrected ROP capability of the downhole drilling tool, a target trajectory to the target;
    analyzing the target trajectory based on one or more drilling parameters; and
    determining a time to target of the target trajectory based on the corrected DLS capability of the downhole drilling tool and the corrected ROP capability of the downhole drilling tool.

2. The method of claim 1, wherein the predicting and the correcting the DLS capability of the downhole drilling tool includes predicting and correcting the DLS capability of the downhole drilling tool offline before drilling.

3. The method of claim 1, wherein the predicting comprises predicting a maximum feasible DLS per inclination for a plurality of inclinations.

4. The method of claim 1, wherein the predicting includes predicting ROP capability of the downhole drilling tool for a plurality of combinations of DLS and inclination.

5. The method of claim 4, further comprising predicting one or more predicted steering parameters for the plurality of combinations of DLS and inclination, wherein the correcting the predicted DLS capability of the downhole drilling tool is further based on the one or more predicted steering parameters.

6. The method of claim 1, wherein the determining the target trajectory includes using one or more of a generalized superellipse curve template or a Bézier curve template, and wherein the analyzing the target trajectory includes applying a cost function to optimize the superellipse curve template or the Bezier curve template, the cost function being based on at the least one of the corrected ROP capability of the downhole drilling tool or the time to target.

7. The method of claim 6, wherein the determining the target trajectory includes constructing a time-to-target plot for a plurality of trajectories associated with a plurality of possible kickoff points to the target, and wherein the analyzing the target trajectory includes selecting a kickoff point associated with a lowest cost.

8. The method of claim 1, wherein the predicting includes iteratively predicting steering parameters and the DLS capability of the downhole drilling tool until a predicted DLS capability of the downhole drilling tool converges with a desired DLS.

9. A method for designing a wellbore, the method comprising:
    predicting, using a physical-based model (PBM) and downhole tool parameters, an achievable dogleg severity, for a given inclination, a (DLS) capability of a downhole drilling tool and steering parameters for a plurality of combinations of inclination and DLS;
    for each combination of the plurality of combinations of the inclination and the DLS, predicting a rate of penetration (ROP) capability of the downhole tool based on the achievable DLS and the steering parameters;
    correcting, using a machine learning (ML) model, the predicted DLS capability of the downhole drilling tool and the predicted ROP capability of the downhole drilling tool;
    determining, using a target, the corrected DLS capability of the downhole drilling tool, and the ROP capability of the downhole drilling tool, a target trajectory to the target;
    analyzing the target trajectory based on one or more drilling parameters; and
    comparing a target trajectory with the corrected ROP capability of the downhole drilling tool for the plurality of combinations to determine a time to target of the target trajectory.

10. The method of claim 9, wherein the plurality of combinations includes minimum and maximum wellbore inclination between 0° and 90°.

11. The method of claim 9, wherein the plurality of combinations includes minimum and maximum wellbore dogleg severity between 0°/100' and 24°/100'.

12. The method of claim 9, wherein the comparing the target trajectory includes comparing a plurality of target trajectories, and further comprising determining a time to target of each target trajectory of the plurality of target trajectories.

13. The method of claim 12, further comprising selecting a selected target trajectory of the plurality of target trajectories that has a minimum time to target.

14. The method of claim 9, wherein the comparing the target trajectory includes using at least one of a look-up table, a graph, or a chart.

15. The method of claim 9, wherein the predicting the rate of penetration includes providing a pseudo rate of penetration for an un-drillable area that has a ROP that declines as a function of dogleg severity.

* * * * *